United States Patent [19]

Noro et al.

[11] Patent Number: 5,086,337
[45] Date of Patent: Feb. 4, 1992

[54] CONNECTING STRUCTURE OF ELECTRONIC PART AND ELECTRONIC DEVICE USING THE STRUCTURE

[75] Inventors: Takanobu Noro; Kunio Matsumoto; Muneo Oshima; Naoya Kanda; Suguru Sakaguchi, all of Yokohama; Akira Murata, Tokyo, all of Japan

[73] Assignee: Hitachi, Ltd., Tokyo, Japan

[21] Appl. No.: 243,796

[22] Filed: Sep. 13, 1988

Related U.S. Application Data

[63] Continuation-in-part of Ser. No. 143,200, Jan. 13, 1988, Pat. No. 4,893,172.

[30] Foreign Application Priority Data

Jan. 19, 1987 [JP] Japan .................. 62-8004
Mar. 14, 1987 [JP] Japan .................. 63-58260
Oct. 28, 1987 [JP] Japan .................. 62-270125

[51] Int. Cl.$^5$ ............... H01L 23/36; H01L 23/48; H01L 21/603
[52] U.S. Cl. ........................ 357/79; 357/81; 357/68; 357/80
[58] Field of Search ............. 357/74, 79, 81, 80, 357/68

[56] References Cited

U.S. PATENT DOCUMENTS 4,607,276 8/1986 Butt ........................... 357/79
4,893,172 1/1990 Matsumoto et al. ........... 357/81

OTHER PUBLICATIONS

Watson—"Full Semiconductor Water Package" vol. 18, No. 3, Aug. 1975, p. 642.
Nihei et al., "Semiconductor Handbook", pp. 128, 136, 277, published by Science Forum K. K., 1986, Sep. 25.
Honda et al., "High Density Packaging Handbook", pp. 238, 307, 240, 1986.

*Primary Examiner*—Rolf Hille
*Assistant Examiner*—S. V. Clark
*Attorney, Agent, or Firm*—Fay, Sharp, Beall, Fagan, Minnich & McKee

[57] ABSTRACT

This invention relates to a connecting structure for electrically connecting an electronic part such as an LSI chip to a substrate, its production method and an electronic device using the former. The present invention is particularly useful for connecting electrically a plurality of chips, for which an absorption function of the difference of thermal expansion in a horizontal direction and capability of displacement in a vertical direction are requisite, to a substrate. Moreover, the connecting structure of the present invention can simplify the fabrication process, has high reliability and can be applied to high performance electronic appliances and apparatuses such as electronic computers.

41 Claims, 21 Drawing Sheets

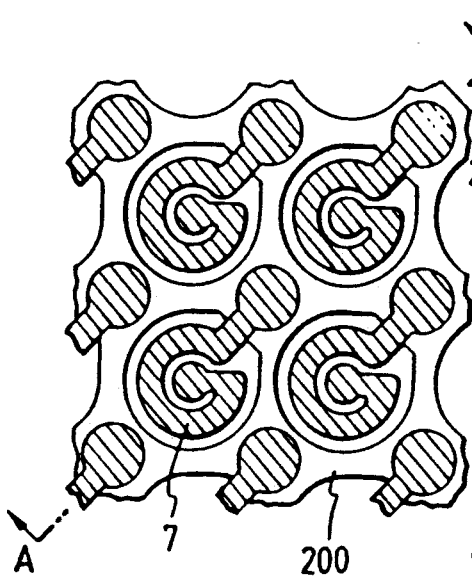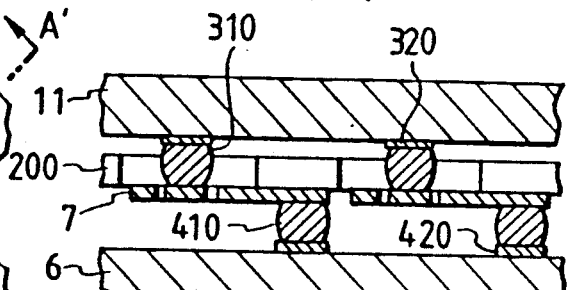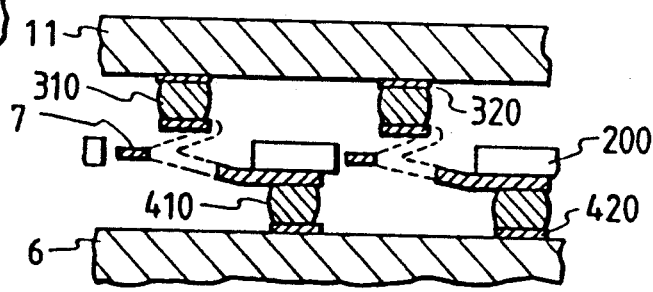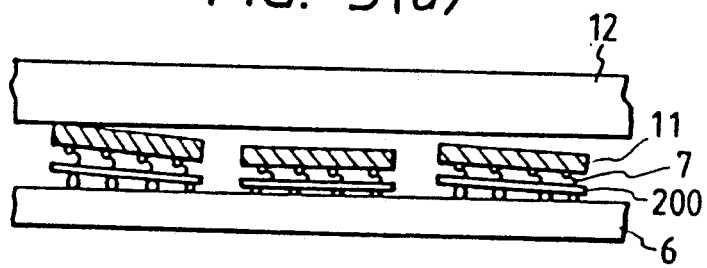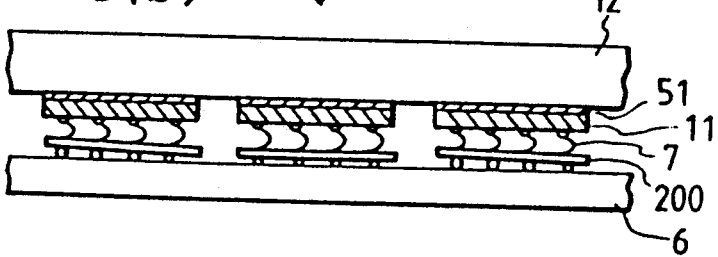

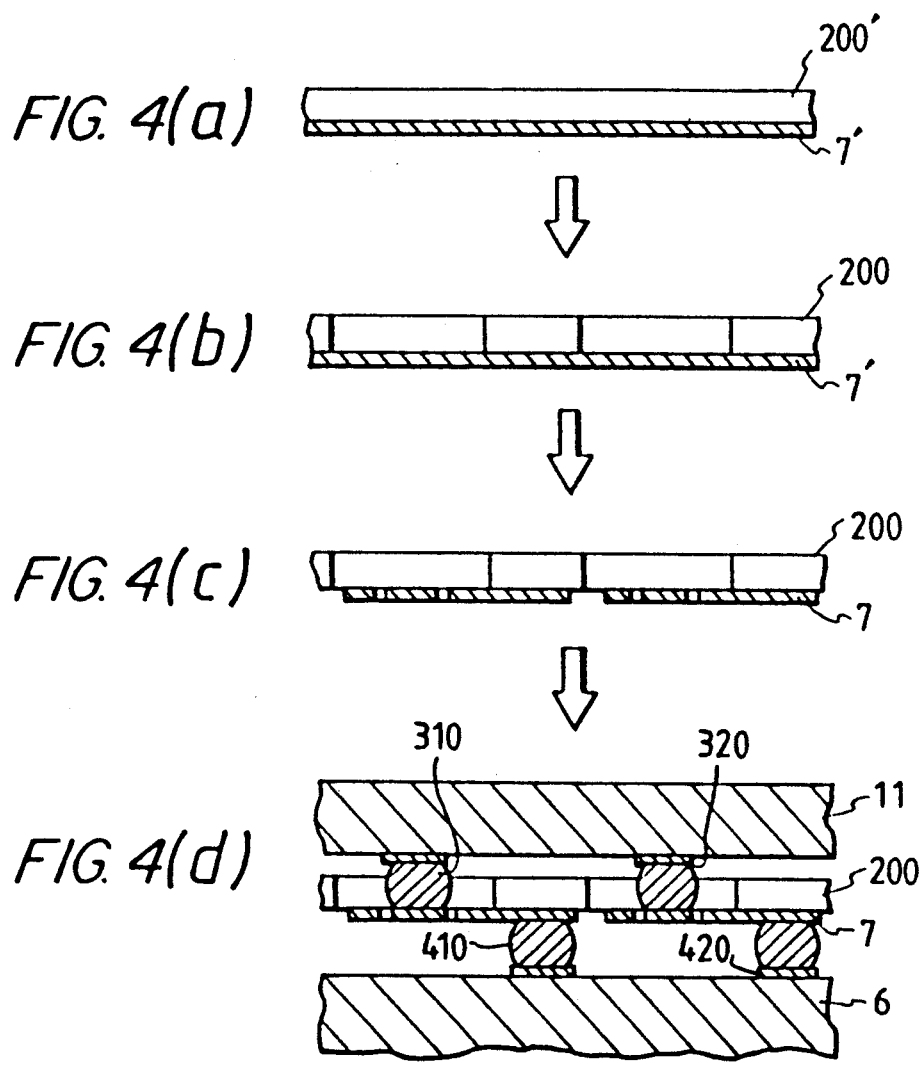

FIG. 19(a)
FIG 19(b)
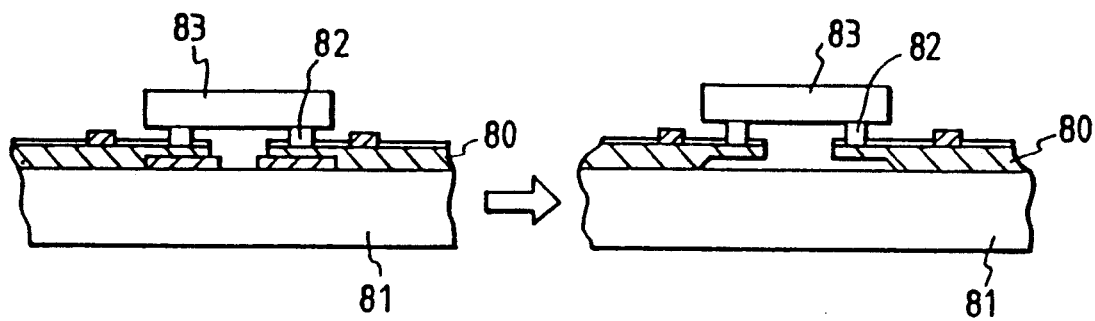
FIG. 20
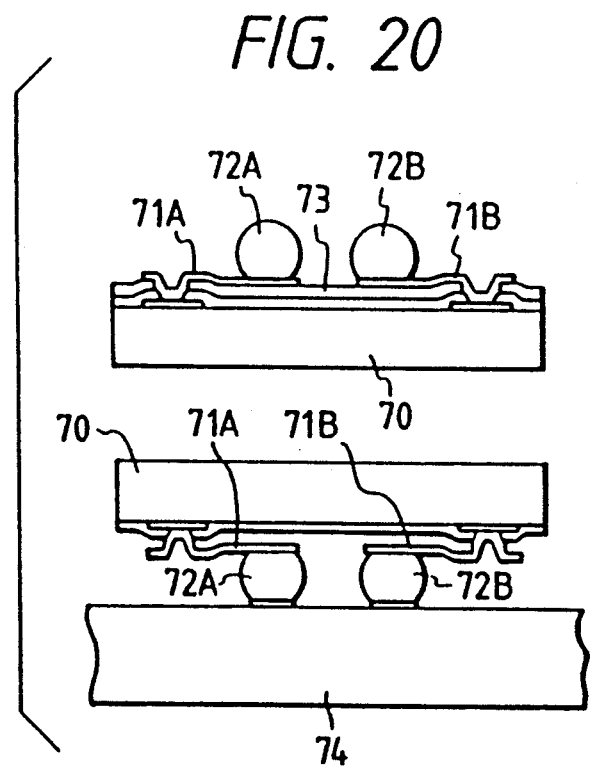

FIG. 26
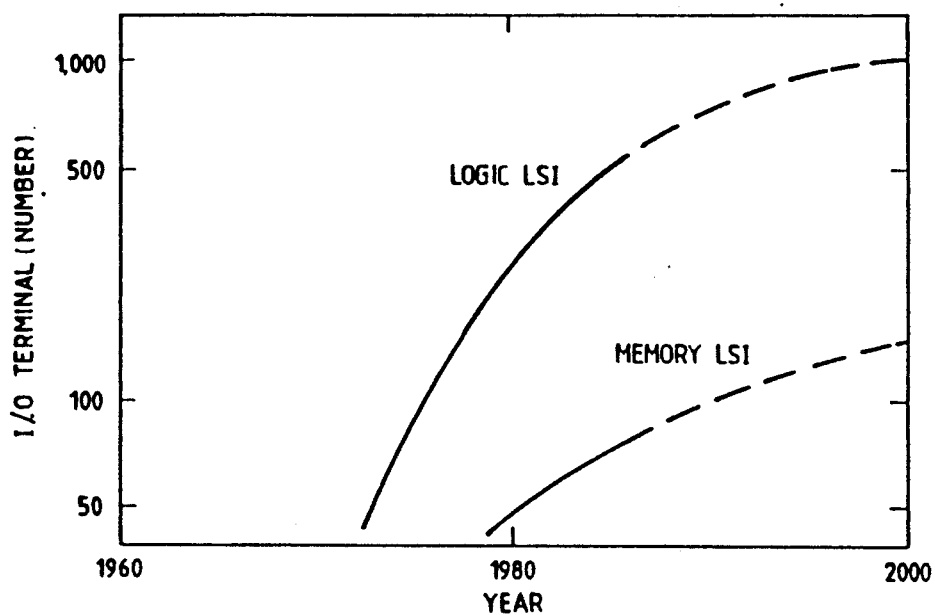
FIG. 27(a)
FIG. 27(b)
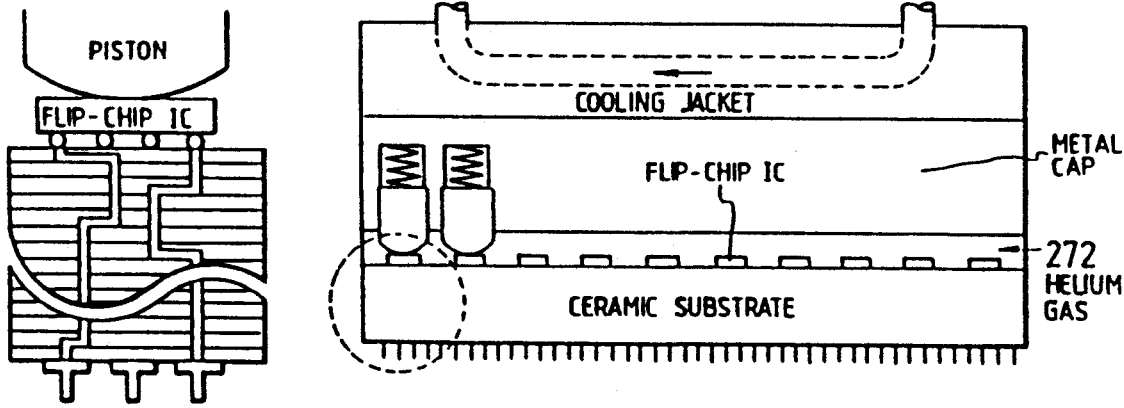

CONNECTING STRUCTURE OF ELECTRONIC PART AND ELECTRONIC DEVICE USING THE STRUCTURE

The present application is a continuation-in-part of Ser. No. 143,200, filed Jan. 13, 1988, now U.S. Pat. No. 4,893,172.

BACKGROUND OF THE INVENTION

This invention relates to a connecting structure of an electronic part, a production method thereof and an electronic device using the structure. More particularly, the present invention relates to a method and a structure for connecting a wiring substrate flexibly with an electronic part such as an LSI chip having a large number of very small connection terminals and to an electronic device structure using the connection method and structure.

Conventional methods of electrical connection of LSI chips can be broadly classified into (1) a wire bonding method, (2) a tape carrier bonding method (or "TAB" (Tape Automated Bonding)) and (3) a flip chip bonding method (Reference 1: Nihei et al., "Semiconductor Handbook", p. 128, published by Science Forum K.K., 1986, Sept. 25).

Among the three connection methods described above, the method (1) and (2) can be applied only to those chips which have a structure wherein the input/output terminals of the LSI chip exist at the peripheral portions of the chip (see Table 3 of Reference 1). The reason in detail will be described later.

On the other hand, the flip chip bonding (3) can be applied to those chips which have a structure wherein connection terminals are disposed not only at the peripheral portions of the LSI chip but also on the entire surface inclusive of the central portion of the chip (hereinafter referred to as a "grid-like terminal disposition"), too.

This method comprises disposing solder bumps at a height of from 100 to 125 $\mu$m on the surface of terminals of an LSI chip to be connected, placing this chip on a wiring substrate and re-heating and melting the solder to connect the chip. This method is known by an abbreviation "C-4 method" (Solid Logic Technology) or "CCB method" (Controlled Collapse Bonding).

FIG. 28 of the accompanying drawing (cited from Reference 2: Honda et al., "High Density Packaging Handbook", p. 238, 1986) is a schematic view showing the principle of the connection mechanism of the CCB method. According to this CCB method, a connection medium (a solder 281 in this case) does not extend beyond the size of the LSI chip in its transverse direction (horizontal direction) and one connection medium (or the solder) does not much have extension in the horizontal direction. Therefore, this method is advantageous for connecting and packaging continuously a large number of LSI chips having the grid-like terminal disposition adjacent to one another.

A ultra-high speed electronic computer, for which high density packaging of a large number of chips is required, such as CTM (Thermal Conduction Module) of IBM can be cited as an application example of the CCB connection and packaging of the chips by this CCB method (see FIG. 27, cited from Reference 2, p. 240).

Packaging of LSI chips having a large number of connection terminals is essentially necessary in electronic computers and high-class electronic devices in the same way as in the example described above. In recent years particularly, the number of terminals of logic LSIs has exhibited a remarkable increase as can be seen from FIG. 26 (cited from Reference 1) and the recent trend is to use the chip structure having the grid-like terminal disposition from the aspects of high density disposition of terminals and their power source characteristics.

As described previously, the wire bonding method or the tape carrier bonding method (hereinafter referred to as the "TAB method") cannot be applied to the logic LSI chips whose terminals are disposed in the grid-like form and in a high density for the following reasons.

As shown in FIG. 25 (cited from page 307 of Reference 1), the wire bonding method extends thin wires of Au or Al from the therminals of the LSI chips to its outer periphery in order to make connection. Therefore, (1) a space is necessary in order to extend and connect the leads (wires) to the outer periphery of the chip, and this means that an excessive space for the connection is fundamentally necessary. (2) Connection of the leads is carried out by use of a device referred to as a "wire bonder" but since the lead wires are bare wires having no insulation coating, the wires come into mutual contact if a large number of wires are connected to the terminals at the center of the chip. For this reason, the wire bonding method is not suitable for the connection of the chips having a high density grid-like terminal disposition such as the logic LSI chips described above.

As shown in FIG. 24 (cited from page 277 of Reference 1), the TAB method disposes the leads for wiring on a film (carrier) and connects the chips through the leads by use of this film as a bulk.

According to this TAB method, excessive lead portions as bonding margins must be secured in order to fix the lead wires to the film and it is not easy to shorten the lead length. In other words, in the conventional film carrier, the intermediate portion between the outer leads and the inner leads is elongated and the leads are fixed to the film base at this portion. The inner leads are wired linearly towards the inside. Therefore, the LSIs that can be connected are limited to those LSI chips which have a relatively small number of terminals that are disposed only at the peripheral portions of the LSIs. However, the number of terminals is very great (at least 500 on about 10 mm square) in the logic LSIs. Moreover, the terminals are uniformly disposed in the grid form not only at the peripheral portions of the LSI chips but also at their center, as described already.

Accordingly, the shape wherein the inner leads are linearly wired plane-wise towards the inside as in the TAB method cannot connect the logic LSI chips having the grid-like terminal disposition.

The problems with the above-mentioned two methods can be summarized as follows: (1) an excessive space more than the occupying area of the LSI chip is necessary, and (2) these methods cannot be applied to the chips having the structure wherein the terminals exist in the grid form to the center of the chip as in the logic LSI chips.

For the reasons described above, it is only the flip chip bonding method as typified by the aforementioned CCB method or the like that can connect and package compactly and in a high density the LSI chips having the grid-like high density terminal structure such as the logic LSI chips.

In the flip chip bonding method such as the CCB method, however, connection is made directly by the ball-like solder. Fundamentally, therefore, the method is a method having a rigid (hard) structure. This rigid structure has recently resulted in the following disadvantages. Hereinafter, the situation will be described.

Recently, the development of chip connection technique having a soft or flexible structure has been required in the field of high performance electronic apparatuses such as an enelectronic computer.

In this field, the connection method having the rigid structure such as the CCB method can no longer satisfy the requirement.

The reason why such an LSI chip connection method having the flexible structure is required is, in the case of the electronic computer, associated with the calculation speed which is one of the most important performance factors of the computer. When viewed on the side of hardware (apparatus) of the electronic computer, its calculation speed is determined by the performance of LSI and the performance of a wiring substrate on which the LIS is mounted.

As to this wiring substrate, a multi-layered wiring substrate made of ceramics (alumina, mullite, etc.) and using W (tungsten) and Mo (molybdenum) as the wiring material has recently been developed and put into practical application.

The wiring substrate described above is effective for connecting and packaging the LSI chips in a high density and for shortening the total wiring length of wirings that have been increasing. However, from the aspect of the transmission performance of electrical signals, the following drawbacks are left unsolved.

(1) The ceramic substrates have generally a high dielectric constant (alumin $\epsilon$: 9~10). Therefore, parasitic charge appears on the interface between the substrate and the wirings and decreases the transmission speed of electrical pulse signals.

(2) W and Mo have electrical resistances greater than those of other wiring materials such as Cu (copper). This deteriorates the waveform of the electrical pulse signal so that it becomes difficult to shorten the time interval between the pulses to be transmitted and this results eventually in the difficulty in increasing the transmission capacity and transmission speed of the pulse signals.

In order to solve these problems, wiring substrates using an organic material having a low dielectric constant such as a polyimide resin ($\epsilon \approx 3$) or the like and Cu for the wiring material have been developed or these is a trend to use them.

However, the coefficient of linear thermal expansion of the high performance wiring substrate described above is greater than that of a ceramic such as alumina and the difference between the substrate and Si as the principal component of the LSI chips (herein after referred to as the "$\alpha$ difference") is as great as from 100 to $130 \times 10^{-7}/°C$.

Accordingly, if the LSI chips are directly soldered to the substrate as in the conventional LSI chip connection method, the following disadvantage develops. Namely, if the LSI chips are fixed to the wiring substrate using the organic material and Cu, thermal stress develops at the solder-connection portion because the $\alpha$ difference is great so that the solder-connection portion cannot withstand the strain due to the thermal stress and is broken, thereby causing disconnection.

Therefore, if the LSI chips are connected to the wiring substrate having a large coefficient of thermal expansion as described above, a method which can either absorb or mitigate the thermal stress-strain resulting from the $\alpha$ difference between them, that is, the LSI chip connection method having the flexible structure, must be employed.

When the ceramic wiring substrate is used as in the prior art technique, the coefficient of thermal expansion of the ceramic wiring substrate such as alumina ($60 \sim 65 \times 10^{-7}/°C$.) is not in complete matching with the coefficient of thermal expansion of the LSI chips ($30 \times 10^{-7}/°C$.) Particularly in recent years, the thermal stress-strain due to the $\alpha$ difference tends to increase with the increase in the size of the LSI chips (from 10 mm square to 16 mm square), and the strain of the thermal stress cannot be borne by the connection by the solder alone. Therefore, in the case where the LSI chips are connected to the ceramic wiring substrate in accordance with the prior art technique, too, the LSI chip connection method having the flexible structure which can absorb or mitigate the strain resulting from the thermal stress has become necessary.

The state of art described above is altogether shown in FIG. 23. In this drawing, the ordinate represents the size of the LSI chip, the abscissa does the $\alpha$ difference between the wiring substrate and the LSI chip and oblique line does a limit value of life by the CCB connection method. The drawing is prepared on the basis of the experimental result of the CCB bonding method carried out by the inventors of the present invention.

It is obvious from the description given above that durability has reached the limit by the mere CCB connection method having the rigid structure.

Now, the drawbacks of the heretofore well known chip connection technique will be summarized as follows.

(1) The wire bonding method and the TAB method cannot connect and package the chips compactly in the horizontal direction.

(2) The CCB method cannot connect and package the chips in the flexible structure.

In order to solve the drawbacks of the conventional LSI chip connection technique, particularly the problem of item (2) described above, Ehrfelt proposes a method in Japanese Patent Laid-Open No. 110441/1986.

However, this method involves the following problems.

(1) The method does not provide deformability (freedom) and flexibility (spring property) in a perpendicular (Z) direction at the junctions between the LSI chips and the wiring substrate.

This means that a disadvantage occurs at the contact portion between the back (non-electrical connection surface) of the LSI chip and a heat transfer block after the LSI chips are connected to the wiring substrate. In other words, each of a plurality of LSI chips is ordinarily connected with some corrugation or inclination (or not under the completely horizontal state). Therefore, a gap (or a contact defect) occurs on the contact interface between the chip and the heat transfer block. To solve this contact defect, it is customary to push the back of the chip by a rod equipped with a spring mechanism (a heat radiation stud) from the side of the heat transfer block (see FIGS. 22 and 27 cited from References 1 & 2).

However, this method reduces the cooling effect and makes the structure of the heat transfer block more complicated.

In contrast, a method which provides the LSI chips with flexibility (spring property) in the perpendicular (Z) direction can provide good contactability and can simplify the conventional heat transfer block.

However, the conventional connection method by soldering alone by the CCB method and the Ehrfelt's connection method described above hardly has, or does not have, sufficient flexibility.

(2) The Ehrfelt's connection method needs two junctions per terminal of the LSI chip.

In accordance with the afore-mentioned Japanese Patent Laid-Open No. 110441/1986, each terminal of the chip must be connected at upper and lower two points when the chip is connected to the substrate. This results in the increase in the number of joints and is not preferable from the aspects of the chip connection work, reliability of electrical connection and electrical resistance. This is one of the problems which should be solved as the subject matter of the present invention. In other words, in high density packaging where a large number of chips are mounted to one substrate, one terminal is preferably connected to the substrate electrode at one position. FIG. 21 shows the structure of the coupling elements where one terminal is connected at two position by the Ehrfelt's method (FIG. 21(a) is a perspective view and (b) is a plan view) and the state where the electrode of the chip is connected to the substrate electrode by use of this coupling element (FIG. 21(c) is a sectional view). Here, the coupling element consists of two pins 60a, 60b that are parallel to each other and connected mutually by a leaf spring 60. In FIG. 21(c), one 60b of the pins of the coupling element is connected electrically to a conductor path 65 of the ceramic substrate 62 and the other pin 60a is connected electrically to the electrode 64 of the chip 61 through the solder 63. Due to this structure, one terminal 64 of the chip is connected to the conductor path 65 of the substrate through the two positions of the pins 60a and 60b of the coupling element and the number of joints becomes two.

Accordingly, even if the flexible structure connection method is employed, it is desired that connection of the LSI chip is completed by single soldering work (simultaneously with a large number of terminals) as has been made by the conventional CCB soldering.

According to the Ehrfelt's connection method, high energy (synchrotron radiation rays are used in Japanese Patent Laid-Open No. 110441/1986 described already) is necessary for producing the leaf spring and the entire production process becomes too complicated to practise it easily.

On the other hand, an attempt of connecting the LSI chips much or less in the flexible structure is proposed by Honda in Japanese Patent Laid-Open No. 121255/1982 separately from the Ehrfelt's method described above.

As shown in FIG. 20, this method forms wiring films 71a, 71B on the LSI chip (electrical circuit element) 70 itself, disposes the metal bumps (solder) 72A, 72B at their tips and connects this LSI chip to the wiring substrate 74. According to this proposal, further, a film 73 (PiQ: film of an organic material) referred to as a "spacer" is removed before or after the chip is connected and thermal fluctuation strain (as described in the specification of the reference) is absorbed by the wiring films and the metal bumps.

According to this proposal, the following points (1) to (4) are not sufficiently clear and moreover, there is the drawback in that elongation or stretchability does not exist in a specific horizontal direction as will be described elsewhere.

(1) the shape and size of the wiring films 71A, 71B (2) formation of the wiring films and the spacer and etching conditions (etachant, etching time, etc.)

(3) definite process conditions inclusive of items (1) and (2)

(4) result of numeric evaluation of the invention

Accordingly, (1) it is not possible to judge what design should be made of the dimension (width, thickness, length and overall shape) of the wiring films 71A, 71B in order to prevent the destruction of solder when "mechanical extension and contraction" (as described in the specification) occurs due to thermal strain of what extent, and (2) it is not easy to set up the plan of the sequence of works such as preparation of chemicals, film formation, etching, and the like, in order to carry out this proposal Furthermore, assuming that the shape of the wiring films 71A, 71B in FIG. 20 is rectangular, this method involves the drawback of the connecting structure in that stretchability hardly exists in the inner horizontal direction in the drawing. In other words, in the step of connection and cooling where the temperature of the solder bumps 72A, 72B drops from the CCB soldering temperature (from about 270° to about 330° C.) to the room temperature, for example, the wiring films 71A, 71B receive vigorous tension (tensile strength) towards the inside in the drawing and result in disconnection.

Still another method is proposed by Amano (Japanese Patent Laid-Open No. 136830/1988). This method is shown in FIG. 19.

According to this method, too, the solder connection portion inevitably receives strong tensile stress in a specific horizontal direction. In other words, a conductor layer 80 gets elongated greatly in an outer horizontal direction when the substrate 81 is heated by heat dissipation of the chip or the like. However, elongation of the LSI chip 83 is not much great, so that the solder connection portion 82 is pulled in the outer horizontal direction. Accordingly, this method involves the structural drawback in that tensile force develops in the specific horizontal direction in the same way as the Honda's method (though the direction is opposite).

As described above, the methods of Honda and Amano are not free from the drawback of the connecting structure as they do not consider how to mitigate the tension in the specific horizontal direction.

As described above, in the industrial field where the LSI chips are connected electrically and high-class electronic apparatuses are packaged and assembled, (1) the LSI chips having a large number of connection terminals such as the logic LSIs (2) must be disposed continuously in a high density and (3) their connection portions must be connected in the flexible structure in all directions. In contrast, the drawbacks of the conventional connection technique can be summarized as follows.

1. The wire bonding method and the TAB method cannot satisfy the requirements (1) and (2) described above.

2. The CCB method cannot satisfy the requirement (3) for the flexible connecting structure.

3. The Ehrfelt's proposal (Japanese patent Laid-Open No. 110441/1986) does not have freedom or spring property in the vertical direction.

4. The proposals of Honda and Amano (Japanese Patent Laid-Open Nos. 121255/1982 and 136830/1987) do not have sufficient freedom or spring property in the specific horizontal direction.

5. Furthermore, there remain many difficulties in carrying out the Ehrfelt's method.

Hereinafter, the difficult conditions to be overcome, or the technical problems to be solved in order to accomplish the objects of the present invention, will be summarized.

Technical Problems (1) When the LSI chips to be packaged are connected electrically, the space necessary for wiring and connection should not be enlarged in the horizontal direction beyond the chip size by the wirings for connecting the chips.

(2) The terminals of the LSI chip to be connected and the terminals of the wiring substrate disposed so as to face the terminals of the LSI chip substantially vertically must be connected by the wiring and connection method satisfying the condition (1) while minimizing the loss of electrical characteristics.

(3) The connection portions or the connection structure should satisfy the conditions (1) and (2) and should have flexibility or spring property in all the horizontal and vertical directions.

(4) When the LSI chip and the wiring substrate are connected, connection must be completed at one junction per terminal of the chip while satisfying the conditions (1), (2) and (3).

(5) Technical means which satisfies the conditions (1) through (4) and which can be executed easily should be developed and established.

(6) The connection portions of the electronic apparatus including the wiring substrate to which the LSI chips are connected and packaged should be able to withstand the thermal cycle while satisfying each item described above.

(7) When the electronic apparatus described above is assembled, the use of the connection method described above should not make the assembly structure of the electronic apparatus complicated and should rather simplify it.

(8) The connection method and structure should satisfy all the conditions described above and the electronic apparatus should be suitable for storing or assembling the wiring substrate to which the LSI chip is packaged.

SUMMARY OF THE INVENTION

In order to solve the technical problems described above, the present invention employs the following plans. First of all, the development plans for the individual problems and for completing the present invention will be described before the description of the definite means for solving the technical problems.

Plans

Re: Technical Problem (1)

In order to prevent the junction from expanding plane-wise beyond the chip size to be connected, the present invention employs the structure wherein a connection medium (hereinafter referred to as a "micro-lead") is disposed at a position within the range of the chip size in the horizontal direction. The range of disposition of this micro-lead is different from that of the leads of the afore-mentioned TAB method (the leads in the TAB method extend beyond the size of the chip; see FIG. 24).

Re: Technical Problem (2)

A metal having high conductivity is used for the micro-lead and a structure which connects three-dimensionally the micro-lead to the terminal of the wiring substrate disposed in such a manner as to face the micro-lead substantially vertically is employed as the connection structure.

Re: Technical Problem (3)

In order to provide the micro-lead with flexibility or spring property in all the horizontal directions, the micro-lead has a curved or spiral shape and to provide it with flexibility or spring property in the vertical direction, a structure which keeps the micro-lead under the floating state in the space is employed.

Re: Technical Problem (4)

One of the ends of the micro-lead is connected to a through-hole conductor or conductor electrode portion on the wiring substrate side.

Re: Technical Problem (5)

The wiring substrate equipped with the micro-leads having the structures (1) to (4) can be produced by the combination of ordinary process steps such as film formation, plating, etching, etc. with ordinary metallic materials.

Next, definite means for accomplishing these objects will be explained.

In order to eliminate the technical problems described above, the present invention is characterized in that a conductive flat spring capable of sufficient deformation in both the horizontal and vertical directions is used between an electronic part having joints and the substrate.

The formation of the conductive flat spring will be described next in detail.

As a first example, there is means for shaping the conductive flat springs as a bulk on an insulating sheet.

In this case, the two points, that is, between the conductive flat spring and the wiring substrate and between the flat spring and the wiring substrate, must be connected after shaping the flat springs. Therefore, there is means for forming the conductive flat spring after the electric connection is in advance formed as to the connection with the wiring substrate. Hereinafter, the formation method of the conductive flat spring by this means will be described in detail. (Hereinafter, the conductive flat spring will be referred to as the "micro-lead".)

Though any ordinary conductive metals can be used as the material for the micro-lead, it is preferred to use Al, Cu, Au, Ni or Cr in view of the coefficient of thermal expansion, spring property (elastic modulus), resistance to repetition of deformation and etachability.

Next, the explanation will be made on the method which directly connects one of the ends of the micro-lead to the wiring substrate with the other end floating in the space. This method is clarified as a result of various experiments carried out by the inventors of the present invention to complete the present invention.

FIGS. 12 and 13 show the principle of the method described above.

As shown in FIG. 13, the method uses a through-hole conductor 4 of the wiring substrate 6, a metal 16 which is closely coupled to the through-hole conductor through a contact hole 15 to which the micro-lead is bonded, a metal layer 18 forming the micro-lead itself through the metal layer 16 and a material layer of a lift-off layer 14 supporting the metal micro-lead layer 18. The method removes the material layer 14 for supporting the micro-lead before or after the micro-lead is formed by etching (see FIGS. 12(c) and 13(c)).

The micro-lead of the present invention having the structure wherein it floats in the space can be formed easily by depositing a gap-forming film which is more soluble by chemicals than the metal (e.g. Cu) used for the micro-lead on the wiring substrate and then forming the micro-lead thereon by plating and etching. The detail of this fabrication method will be described in the later-appearing embodiments. Incidentally, the material for the gap-forming film and the gap-forming material will be hereinafter referred to as the "lift-off material" and the "lift-off film", respectively, in this specification. In the production method of the wiring substrate equipped with the micro-leads of the present invention, selection of the lift-off material is of importance. When Cu is used for the micro-lead in the present invention, the following lift-off materials can be listed. The lift-off materials may be those which are more soluble than the material used for the micro-lead.

(1) Al or Al—Si
(2) MgO
(3) CuO
(4) AlN
(5) $B_2O_3$—$SiO_2$ system glass
(6) organic materials soluble in organic solvents Among the lift-off materials listed above, (1) to (4) are easily soluble in alkaline chemicals in which Cu is hardly soluble, while (4) to (6) are soluble in hot water or organic solvents. As a result, the lift-off film can be removed by use of alkaline solutions in which Cu is hardly soluble or hot water and organic solvents in which Cu is not soluble, after the micro-lead is formed by etching using Cu. In other words, after this step, one of the ends of the micro-lead is connected to the conductor portion of the wiring substrate or floats in the space.

The present invention has become feasible by this suitable selective etching step and discovery and employment of suitable conditions.

The following metals can be listed as the metal for bonding the micro-lead to the through-hole conductor of the wiring substrate:

(1) Ni or Ni alloy
(2) Au or Au alloy
(3) Cr or Cr alloy

The metals listed above are selected in accordance with the micro-lead to be bonded and with the kind of metal of the through-hole conductor of the wiring substrate, but any of them may be selected so long as they are compatible to each other. These bonding metals are extremely effective when the through-hole conductor is made of W or Mo.

Furthermore, any metals can be used for the micro-lead so long as they are high electrical conductors. When Cu is used, for example, other effects will be obtained by wrapping this metal in the sandwich form by Cr or the like, and these effects will be further clarified in the later-appearing embodiments. One of these effects is as follows. It functions as a solder dam when the LSI chip is connected to the micro-lead by soldering. In other words, since Au 22 disposed as the solder bump is extremely wettable to the solder, it can be soldered easily.

On the other hand, since Cr does not have wettability to the solder, the solder does not attach at the Cr 19 portion other than Au and thus the solder does not attach to undesirable portions.

Incidentally, it is not always necessary to use the bonding metal described above when the through-hole conductor is made of Cu and the micro-lead is also made of Cu as shown in FIG. 13. In such a case, Cr 19 for the solder dam can be replaced by covering the surface of Cu of the micro-lead with an oxide coating film 26 at portions other than the Au bump, and this method will be described in detail in the later-appearing embodiments.

The wiring substrate equipped with the micro-lead as the first part of the present invention can be obtained by use of the definite technical means described above in accordance with a method of a connecting structure of an electronic part comprising:

a step of forming a wiring substrate having electrodes formed on the surface to which an electronic part is to be connected;

a step of forming a coating film of lift-off material on the entire surface of the wiring substrate except in the areas of the electrodes;

a step of forming a conductor film which forms a conductive flat spring on the lift-off material coating film;

a step of forming a resist film having a spiral pattern for the conductive flat spring on the conductor film;

a step of patterning the conductor film to a desired shape through the resist film; and a step of dissolving and removing the lift-off material coating film and the patterned resist film.

In the wiring substrate equipped with the micro-leads described above, it is possible to reduce the thermal stress occurring at the solder bond portion even when the difference of the coefficients of thermal expansion is great between the LSI chip and the wiring substrate. It will be assumed that the electrode (not shown) of the LSI chip 11 is bonded by the solder 10 through the micro-lead 7 by use of the wiring substrate 6 equipped with the micro-leads as shown in FIG. 5(b). In this case, the coefficient of thermal expansion of the wiring substrate 6 is great while that of the LSI chip 11 is small. Therefore, when the wiring substrate (hereinafter referred to simply as the "module") to which the LSI chip is mounted and is connected electrically is operated and eventually the LSI chip causes heat and attains a high temperature (up to 80° C.), the substrate gets elongated much more than the LSI chip so that the difference of deformation and displacement occurs between the LSI chip and the substrate.

Conventionally, the soldered portion of the LSI chip is broken by this difference of displacement. In the wiring substrate equipped with the micro-leads in accordance with the present invention, however, the micro-lead itself undergoes displacement in the X and Y directions or in all the horizontal direction by the distance corresponding to the displacement and can thus mitigate the stress. Furthermore, since this micro-lead has a spring property or can deform in the vertical (Z) direction, too, the chip can be completely brought into close contact with the heat transfer block 12 disposed on the back (upper side) of the LSI chip. As a result, the cooling effect of the LSI chip can be secured sufficiently and the heat radiation stud having a complicated structure that has been proposed in the past can be eliminated and the heat transfer block can be simplified.

In the connecting structure of the present invention, one of the ends of the micro-lead extends directly from the conductor portion of the wiring substrate (see FIGS. 5(b), 9). Therefore, connection of the LSI chip can be completed by soldering 10 of one point per terminal of the chip.

BRIEF DESCRIPTION OF THE DRAWINGS

FIG. 2 is a structural view of a conductive flat spring in accordance with the first embodiment of the present invention, wherein 2(a) is a plan view of the conductive flat springs formed as a bulk on an insulation sheet and 2(b) and 2(c) are sectional views taken along line A-A' with (c) being a sectional view when the conductive flat spring undergoes displacement in the vertical direction in (b);

FIG. 3 is a sectional view showing the relationship of position between an LSI chip, the wiring substrate and a heat transfer block, wherein 3(a) is a view before the LSI chip, the wiring substrate and the heat transfer block are integrated, and shows that non-uniformity occurs from chip to chip, and 3(b) is a view showing the structure when they are integrated through a heat connecting portion;

FIGS. 4(a) to 4(d) are sectional views showing step-wise the production method of a connecting structure in the first embodiment of the present invention;

FIGS. 19(a), 19(b), 20, 21(a), 21(b), 21(c) are sectional views and a schematic view showing the conventional method of connecting the chip;

FIG. 26 is a diagram showing the number of terminals of the LSI chip;

FIGS. 27(a) and 27(b) are schematic view showing packaging of a conventional electronic apparatus.

DESCRIPTION OF THE PREFERRED EMBODIMENTS

Hereinafter, the first embodiment of the present invention will be described with reference to FIGS. 2, 3 and 4.

FIG. 2(a) is a plan view of conductive flat springs formed as a bulk on an insulation sheet in accordance with the present invention, (b) is a sectional view taken along line A-A' and showing the connection state and (c) is a sectional view (front view of the conductive flat spring portion) showing the connection state when the chip is moved upward after connection. FIG. 3 shows the relationship of position between the chip, the substrate and the heat transfer block when the connecting structure of the present invention is used. FIG. 3(a) shows the chip before heat connection with respect to the heat transfer block and 3(b) shows the chip after heat connection. FIG. 4 shows the production method of the connecting structure in accordance with the present invention.

Figure 1:
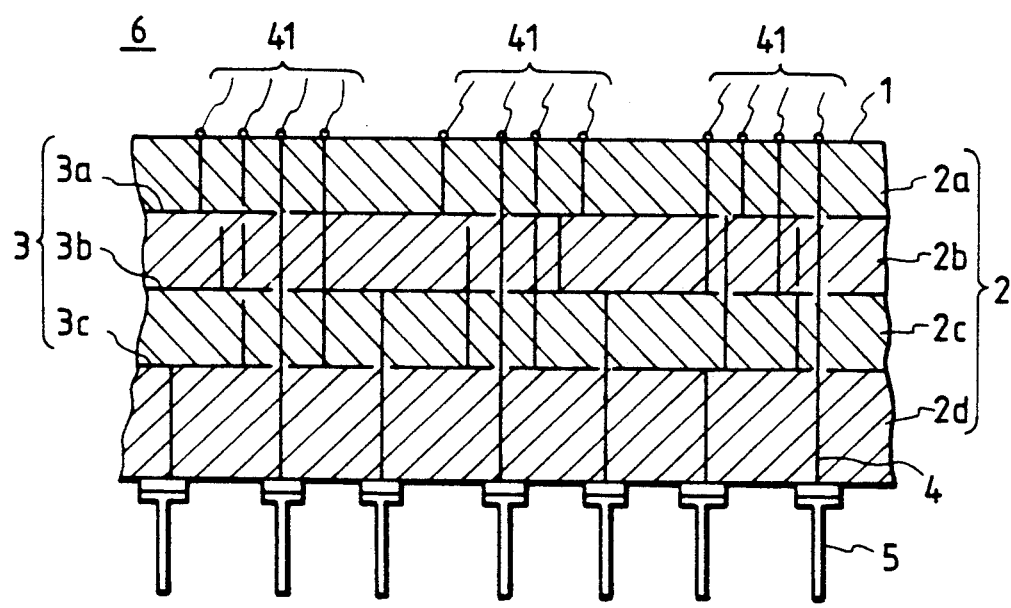
FIG. 1 is a partial sectional view of a wiring substrate of an electronic apparatus in accordance with the present invention.
Figure 5A:
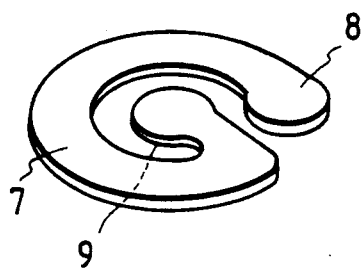
FIGS. 5(a) and 5(b) are a theoretical sectional view showing the shape and bonding of a micro-lead, a chip connecting structure and packaging of the heat transfer block in accordance with the second and third embodiments of the present invention.
Figure 5B:
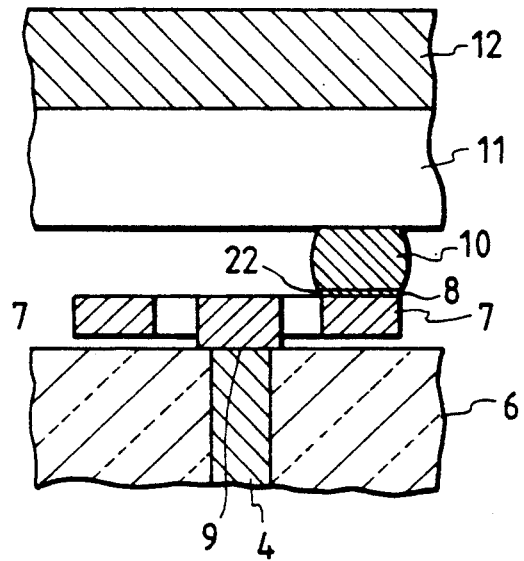

In FIGS. 1 to 3, reference numeral 7 represents a conductive flat spring also known as lead member; 200 is an insulation sheet; 11 is a chip; 6 is a substrate; 12 is a heat transfer block; 310 and 410 are solder; 320 is a chip electrode; 420 is a substrate electrode; 51 is a heat connection portion for which heat transferrable grease such as diamond grease is used; 7' is the conductive flat spring; and 200' is the insulation sheet.

FIG. 2(a) shows the case where a spiral shape is employed for the conductive flat spring 7. The center of the spiral of each conductive flat spring 7 is aligned with the hole of the insulation sheet 200 bored so as to correspond to the position of the chip electrode and the other end of the spring is fixed to the insulation sheet 200 The center of the spiral of each of these conductive flat springs 7, that are altogether fixed, is fixed to the chip electrode 320 while the other end is fixed to the substrate electrode 420 by solder 310, 410, respectively, as shown in FIG. 2(b).

Since the electrical connecting structure of the chip 11 and the substrate 6 is constituted as described above, the chip 11 can be independently moved upward within a certain limit while keeping the electrical connection as shown in FIG. 2(c). This function can absorb the warp of the substrate 6 and non-uniformity of height of joints of the chips when a plurality of chips 11 are connected to the same substrate 6, and makes it possible to thermally connect the chips 11 to the heat transfer block 12 through the heat connection portion 51. The connecting structure can also absorb the difference of thermal expansion between the chips 11 and the substrate 6 in the horizontal direction and can prolong the life of the connection system such as the solders 310 and 410.

When connection is made, the same effect can be obtained similarly by reversing the insulation sheet 200 equipped with the conductive flat springs 7 and connecting the center of the spiral of each conductive flat spring 7 to the substrate electrode 420 and its other end to the chip electrode 320 (this connection is not shown in the drawing).

Next, the production method of the connecting structure described above will be explained with reference to FIG. 4. In FIG. 4(a), a thin sheet-like conductive flat spring material 7' (Cu, Cu alloy or a composite metal of Cu) and an insulation sheet material 200' are bonded or coupled Here, it is possible to use, as the insulation sheet material 200', a polyimide resin, a glass-epoxy resin, a glass-polyimide resin, a polyester resin, a polyimide resin in quartz fibers or a polyimide, epoxy or polyester resin with carbon fibers The polyimide resin, the glass-epoxy resin and the glass-polyimide resin are particularly preferred from the aspect of heat resistance.

Next, in FIG. 4(b), holes each greater than the spiral portion of the conductive flat spring 7 are bored at the positions of the insulation sheet material 200' corresponding to the chip electrodes 320 by photo-etching or mechanical punching to form the insulation sheet 200. Furthermore, in FIG. 4(c), the spiral shapes show in FIG. 2(a) are formed at the predetermined positions of the conductive flat spring material 7' by etching to form the conductive flat springs 7. At this time, one of the ends of each conductive flat spring 7 is kept fixed to the insulation sheet 200 and a plurality of conductive flat springs 7 can be shaped altogether with high accuracy of mutual position and can be handled easily as a whole. Finally, in FIG. 4(d), each conductive flat spring 7 is connected to the chip electrode 320 and to the substrate electrode 420 by the solders 310, 410, respectively.

In the production method described above, it is possible to bore the predetermined holes on the insulation sheet material 200' before bonding the conductive flat spring material 7' to the insulation sheet material 200' and then to bond the conductive flat spring material 7' to establish the state shown in FIG. 4(b). Furthermore, in the production steps to the step shown in FIG. 4(d), it is possible to use thermal compression, brazing or welding in place of connection by the solder 310, 410 to connect the conductive flat spring 7 to the chip 11 or to the substrate 6.

Next, the dimension of the conductive flat spring in accordance with the present invention will be described in detail The range of dimension of each conductive flat spring shown in FIG. 2 is from 10 to 40 μm thick and from 40 to 70 μm wide, and its spring constant is from 300 to 600 g/mm in the horizontal direction and from 40 to 90 g/mm in the perpendicular direction. The density of junctions is from 600 to 1,200 points/10 mm square. This range also holds true of the other embodiments of the invention.

The most preferred dimension is such that the thickness is 20 μm, the width is 50 μm, the spring constant is 450 g/mm in the horizontal direction and 65 g/mm in the vertical direction and the density of junctions is 1,000 points/10 mm square.

As described above, in accordance with the electrical connecting structure of the chip in accordance with the present invention a plurality of chips can be independently connected thermally to the heat transfer block without losing the absorption function of the difference of horizontal thermal expansion between the chips and the substrate and the structure of the cooling system can be extremely simplified. In other words, in comparison with the conventional complicated cooling system which absorbs the non-uniformity of the levels of the back of a plurality of chips resulting from the limit of working and assembly by the independent position adjustment of the heat transfer block for the individual chips or by compression pressure adjustment means, the embodiment of the invention eliminates the necessity of the adjustment function and can remarkably simplify the cooling system. This provides the effects of high assemblability and high reliability when high density disposition packaging of chips generating high heat is carried out.

Hereinafter, the second to ninth embodiments of the present invention will be described with reference to FIGS. 5 to 18 and Tables 1 and 2.

Embodiment 2

Formation of micro-lead on wiring substrate - (1):

FIG. 1 is a sectional view showing the structure of the substrate main body 6 as the starting point for the formation of the wiring substrate equipped with the micro-lead. This embodiment represents a substrate main body having a multi-layered structure consisting of a base layer 2d of alumina type ceramics and inter-level insulation layers 2a, 2b, 2c made of a polyimide type heat-resistant resin and deposited on the base layer 2d. External terminal pins 5 for signal input/output, power supply, grounding, etc., are implanted on the back of the ceramic base layer 2d. A wiring pattern 3c is deposited on the surface of the base layer 2d and through-hole conductors 4 inside the base layer 2d are connected electrically to the pins 5, to the surface circuit pattern 3c and to the circuit patterns 3a, 3b of its upper layers 2a, 2b, 2c. In other words, the circuit patterns 3a, 3b are formed on the surface of these inter-level insulation layers 2b, 2c in the planar direction and the vertical through-hole conductors 4 connecting mutually the upper and lower layers are disposed inside the base layer 2d. Electrodes 41, to which the micro-leads are to be connected, are exposed on the surface 1 of the uppermost insulation layer 2a, and are connected electrically to the circuit patterns 3a, 3b, 3c of the lower layers through the through-hole conductors 4 and to the through-hole conductors 4. Incidentally, all of the circuit pattern 3, the through-hole conductors 4 and the external exposed electrodes 41 are made of copper (Cu).

Figure 6A:
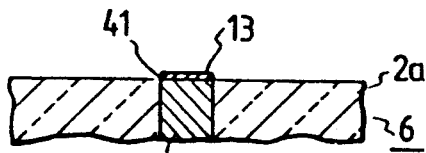
FIGS. 6(a)-(i) and 7(a)-(h) are sectional views showing step-wise the production process of the wiring substrate equipped with the micro-leads.

Next, the process for forming the micro-leads 7 on the electrodes 41 of the wiring substrate main body 6 will be explained with reference to the process views of FIGS. 6(a) to 6(i). The drawings are enlarged sectional views of the portion near the upper surface 1 of the substrate 6 where the through-hole conductor 4 is disposed Here, FIG. 6(a) is the process view when an Ni film 13 as a micro-lead bonding material is formed in a thickness of about 0.3 μm on the electrode 41 immediately after the wiring substrate 6 is formed and before the electrode 41 on the exposed Cu surface at the upper tip of the through-hole conductor 4 is oxidized.

This Ni film 13 is formed by sputtering by use of a mask having the holes that are formed in registration with the positions of the exposed electrodes 41 of the through-hole conductors 4 of the wiring substrate. Each through-hole conductor has a diameter of about 100 μm and the mask diameter is a little bigger, that is, 110 μm.

Figure 6B:
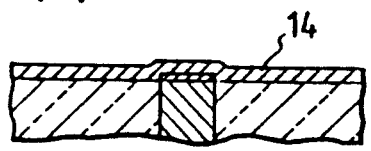
Figure 6C:
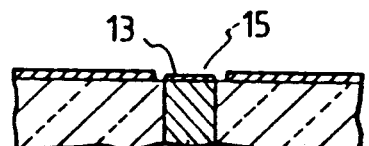

Next, as shown in FIG. 6(b), an about 5 μm-thick Al film 14 as a lift-off material is formed by sputtering on the entire surface of the wiring substrate.

Then, an alkali-resistant resist (not shown) is coated and dried on the lift-off material 14 and the resist on the Ni film 13 is removed by photo-etching. Next, the Al film of the lift-off material 14 on the Ni film 13 is removed by an aqueous NaOH solution adjusted to 8% (percent by weight; hereinafter the same), and after contact hole 15 is bored, washing with water and drying are effected to obtain the wiring substrate under the state shown in FIG. 6(c).

Figure 6D:
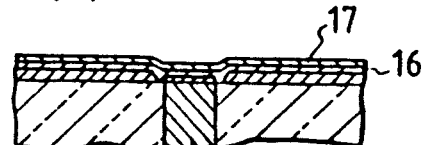

Next, as shown in FIG. 6(d); a 1,000 Å-thick Cr film 16 and a 2 μm-thick Cu film 17 are formed by sputtering on the entire surface of the wiring substrate.

Figure 6E:
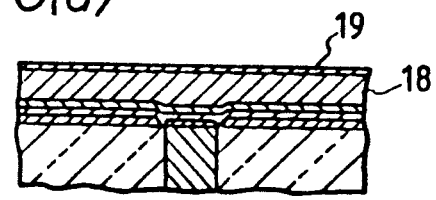

A Cu layer 18, whose thickness is increased up to 20 μm by electro-plating, is formed on this Cu film and then a Cr film 19 is formed in a thickness of 1,000 Å by sputtering. The state at this time is shown in FIG. 6(e).

In other words, Cr-Cu-Cr is under the sandwich state where it is formed on the entire surface of the wiring substrate while being connected to the Ni film 13 deposited on the upper surface at the upper part of the through-hole conductors. This thick Cr-Cu-Cr film functions as the conductor layer for forming the micro-lead itself by the later-appearing etching step. The three-layered structure is hereby employed in order to prevent the micro-lead from curling.

Incidentally, the film formation condition of Ni, Al, Cr and Cu described above by spattering is at a pressure of about 0.2 Pa in an Ar stream while Cu plating is made by electro-plating using an aqueous copper pyrophosphate solution.

These conditions and set-ups belong to ordinary industrial technique practised generally at present and can be easily reproduced.

Annealing is then carried out at 200° C. for 0.5 hour in order to remove any residual stress of the Cr-Cu-Cr film on the wiring substrate thus prepared.

Next, when the micro-lead is formed by etching the Cr-Cu-Cr film as described above, the step of depositing an Au layer to the portion corresponding to the position of the chip connecting portion (8 in FIGS. 5 and 15) is carried out. This Au layer improves wettability with the solder for connecting the LSI chip 11 and prevents the surface oxidation of this contact portion in air. In the Cr-Cu-Cr film described above, Cr has lower wettability than Au with solder.

Therefore, the Au layer is effective for preventing (as a solder dam) the solder from flowing out to the lead portions other than the junction and from attaching to unnecessary portions Hereinafter, the step of disposing the Au film only to the LSI chip connecting portion 8 on the Cr-Cu-Cr film will be explained.

First of all, a positive type resist 20 for Au plating is coated and dried on the Cr film 19 in FIG. 6(e).

Figure 6F:
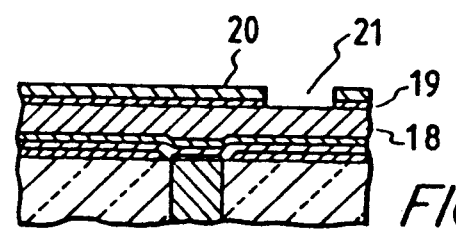
Figure 15A:
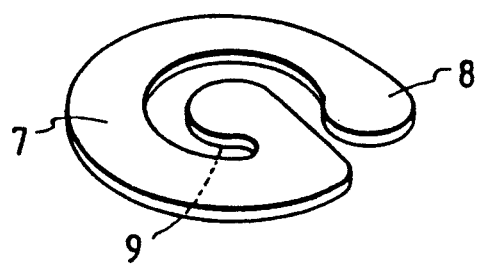
FIGS. 15(a), 15(b), 16(a), 16(b), 17, 18(a), 18(b) are schematic views showing some examples of the shapes of the micro-leads.
Figure 15B:
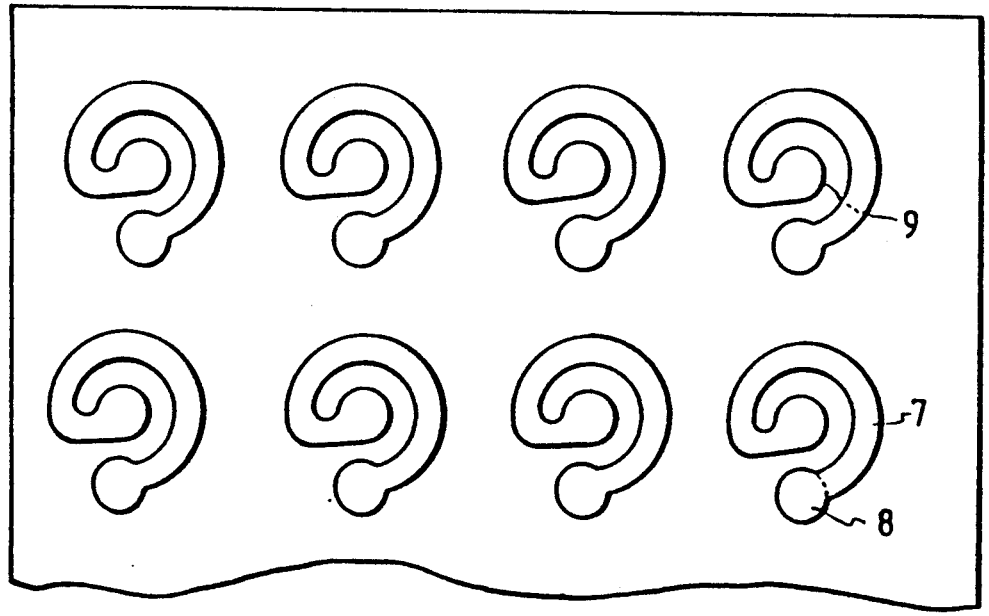

Next, the center of the circle of the conductor junction 9 of the micro-lead pattern 7 shown in FIG. 15 is aligned with the center of the circle of the exposed electrode 41, the micro-lead pattern 7 is then depicted as a whole and part 21 of the resist film 20 shown in FIG. 6(f) is removed at the position and in the size corresponding to the chip connecting portion 8 (circle partitioned by dotted line: about 100 μm φ). Incidentally, in this step, the hole 21 is formed by effecting exposure through the mask pattern on which the micro-lead pattern end portion 8 shown in FIG. 15 and then effecting development.

Figure 6G:
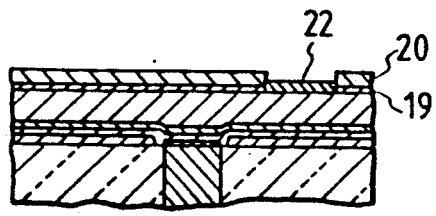

After the Cr film 19 at the same portion is etched for about 2 minutes at room temperature using a 16.6% of aqueous Ce(NO$_3$)$_4$2NH$_4$NO$_3$ solution, an Au film 22 is formed by ordinary electro-plating as shown in FIG. 6(g). Then, the resist film 20 is removed to obtain the wiring substrate under the state shown in FIG. 6(h).

Figure 6H:
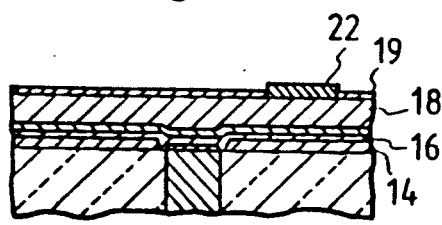
Figure 6I:
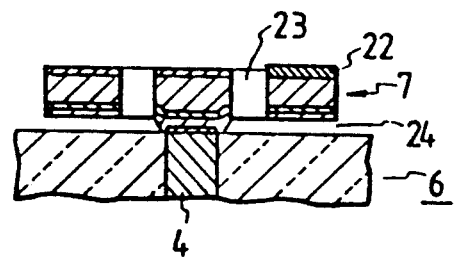

Next, in order to form the micro-lead 7, a water-soluble negative type resist is coated and dried (not shown) on the entire surfaces of the Au film 22 and Cr film 19 shown in FIG. 6(h).

The chip connecting portion 8 of the micro-lead pattern shown in FIG. 15 is located to the center of the circle of the Au plating film 22 and the through-hole conductor connecting portion 9 is located to the center of the circle of the exposed electrode 41 of the through-hole conductor 4. The group of patterns is depicted by exposure and development using the micro-lead pattern, whose part is shown in FIG. 15, as the mask and the resist at the other portions is removed by photo-etching, thereby forming the resist pattern on which the micro-lead pattern is depicted.

Next, the Cr-Cu-Cr film exposed by the formation of the resit pattern is removed by etching first by use of a 16.6% aqueous Ce(NO$_3$)$_4$2NH$_4$NO$_3$ solution to etch the Cr film for 2 minutes, then a 3.8% aqueous FeCl$_3$ (ferric chloride) solution to etch the Cu film for 50 seconds and Cr by the cerium nitrate solution described above, thereby forming the group of micro-leads part of which is shown in FIG. 15. In other words, the portion of the Cr-Cu-Cr film corresponding to the micro-lead as a whole is left and all the other portions are removed by etching Reference numeral 23 represents hollow portions after removal of the Cr-Cu-Cr film.

Next, the resist pattern (not shown) for the micro-lead which is resistant to etching and is now useless is removed by an aqueous NaOH solution whose pH is adjusted to about 10.5 and then Al 14 of the lift-off layer is removed by etching by use of a 15.3% NaOH solution at 55° C. for 85 minutes. Thereafter, washing with water and drying are carried out to obtain the wiring substrate equipped with the micro-leads shown in FIG. 6(i). In this drawing, reference numeral 4 represents the through-hole conductor, 7 is the micro-lead and 24 is the gap between the micro-lead and the wiring substrate which is formed by the removal of the Al film of the lift-off layer 14 that has existed between the micro-lead and the wiring substrate.

Various dimensions of the wiring substrate equipped with the micro-leads which constitutes one of the characterizing features of the present invention are as follows.

(1) Dimension of micro-lead:
   lead belt width: 50 μm
   lead belt thickness: approx. 20 μm
   pitch between leads: 450 μm
(2) Number of micro-leads:
   per chip connection: 1,000

Figure 16A:
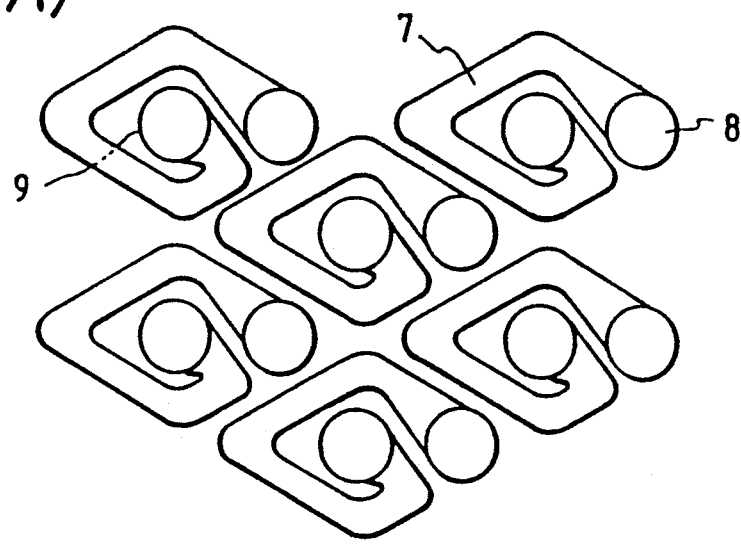
Figure 16B:
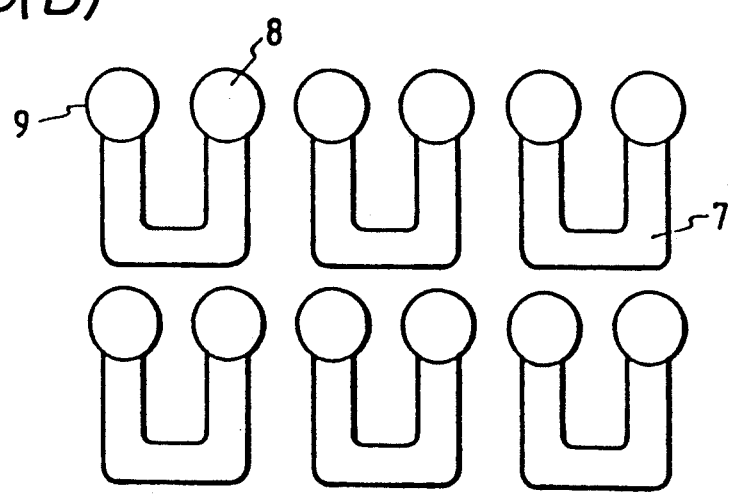
Figure 17:
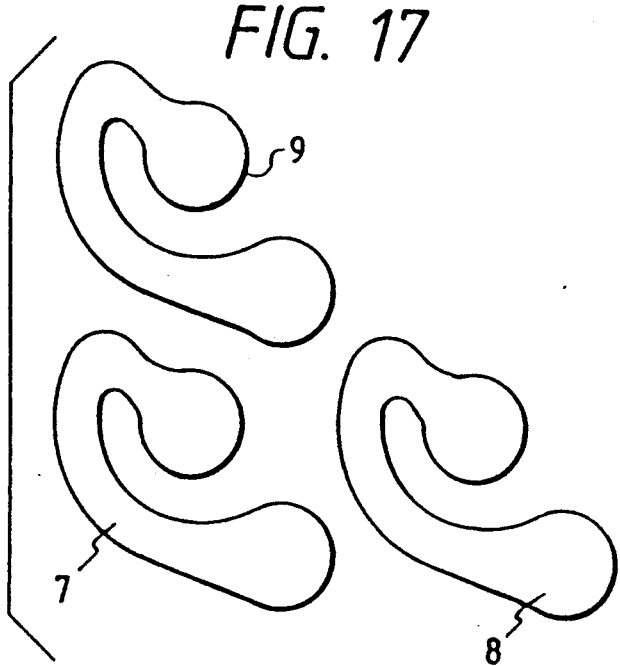

FIGS. 15 to 17 show some examples of the shapes of the micro-leads proposed above. Here, the thickness (height) of the lead is below the width (in the horizontal direction). This is the dimensional condition which provides the micro-lead with suitable spring property and makes it possible to form the micro-lead by etching (as will be described elsewhere).

Here, the effect (life of the solder connected portion) will be estimated by a definite element method and a connected solder life estimation formula about the case where Cu is assumed to be used as the micro-lead material and the micro-lead has the spiral shape shown in FIG. 15 (line width 50 μm, space width 50 μm, spiral diameter 300 μm, thickness 20 μm).

Set condition (1) coefficients of thermal expansion ($\alpha \times 10^{-7}$/°C.)

LSI chip ... α = 30 (0~80° C.)
dimension = 10 × 10 mm $$\left(L = \frac{\sqrt{2}}{2} \times 10\right)$$

wiring substrate ... α = 170 (0~80° C.)
dimension = 10 × 10 mm
(connecting portion, $$L = \frac{\sqrt{2}}{2} \times 10)$$

Figure 14A:
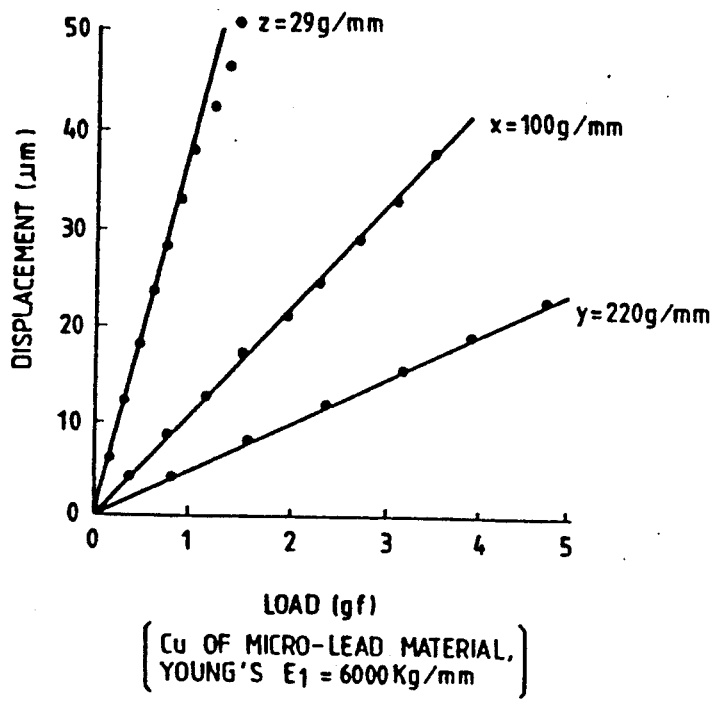
FIGS. 14(a) and 14(b) are diagrams showing the result of calculation of stress of the micro-lead.
Figure 14B:
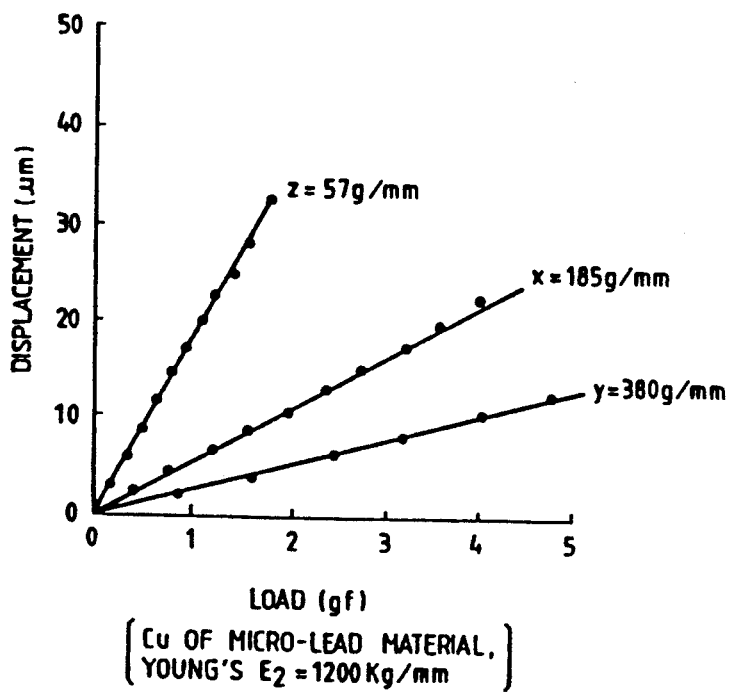

(2) range of temperatures used and thermal cycle time:
0° C.~80° C. (ΔT), one cycle/day FIG. 14 shows the results of calculation under the conditions described above. It is hereby assumed, however, that the Young's modulus of solder is 317 kg/mm² and that of Cu, 6,000 to 12,000 kg/mm².

The spring constant of the micro-lead shown in FIG. 14 is 29 to 57 g/mm in the vertical (Z) direction and 100 to 380 g/mm in the horizontal (x, y) direction.

The difference of displacement Δy between the chip and the wiring substrate due to cooling and heating is Δy=8 μm and the maximum equivalent strain $\Delta_{\epsilon eq}$ is from 0.3 to 0.5%. The life of the solder connected portion can be estimated to be from 26 to 49 years from these values.

As described above, the life is sufficiently long and is estimated to have an effect in comparison with life duration impossibility when the micro-leads are not used.

Figure 23:
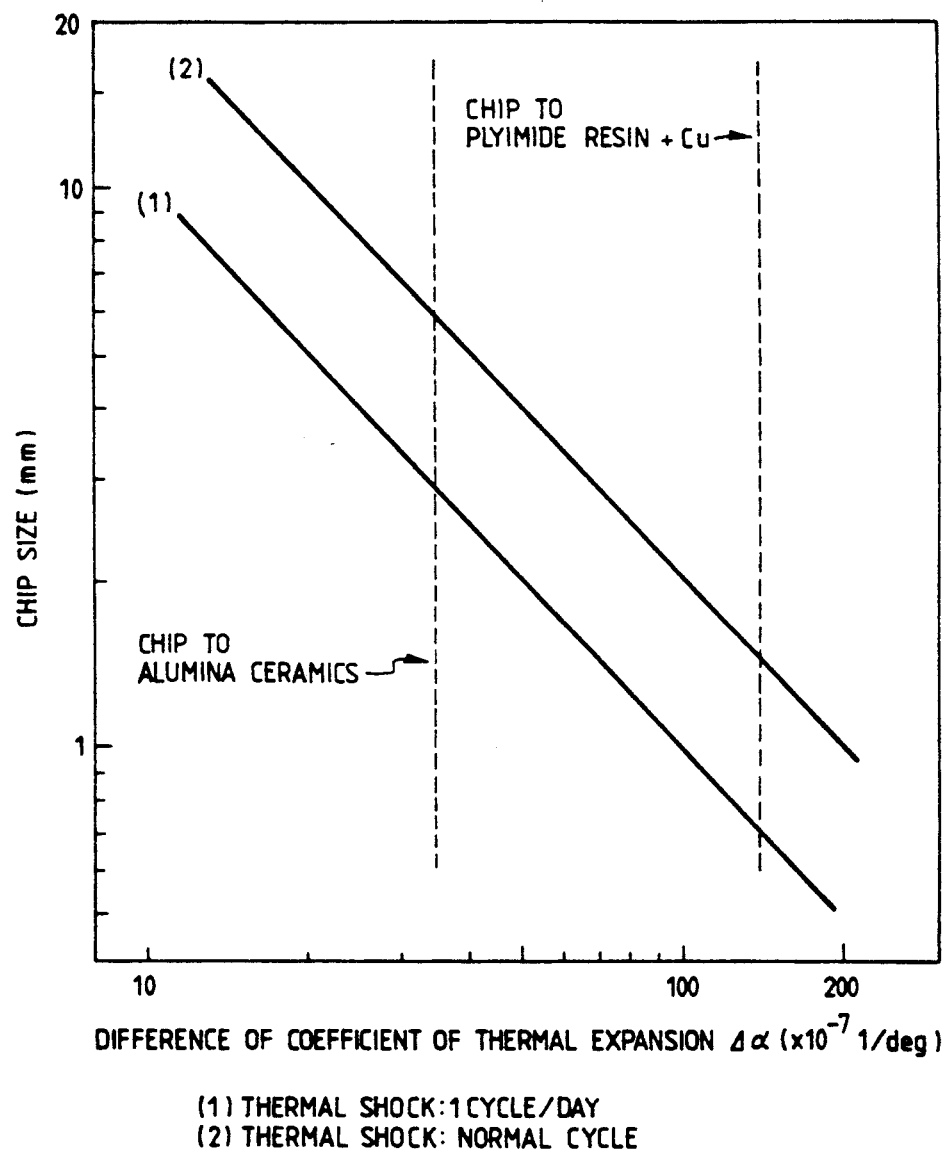
FIG. 23 is a diagram showing the result of the life limit test of the CCB connection portion.
Figure 24:
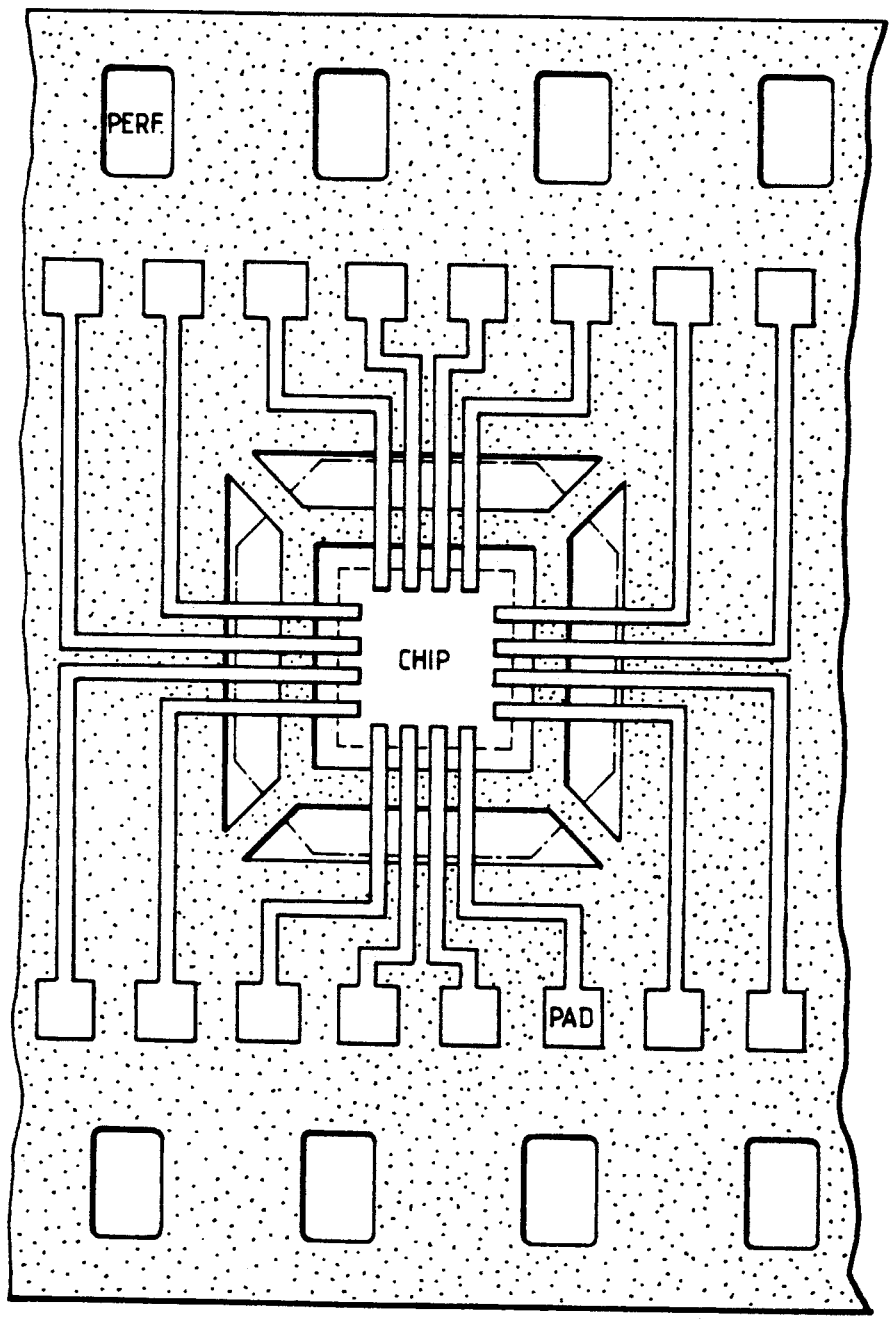
FIG. 24 is a plan view showing the TAB method.
Figure 25:
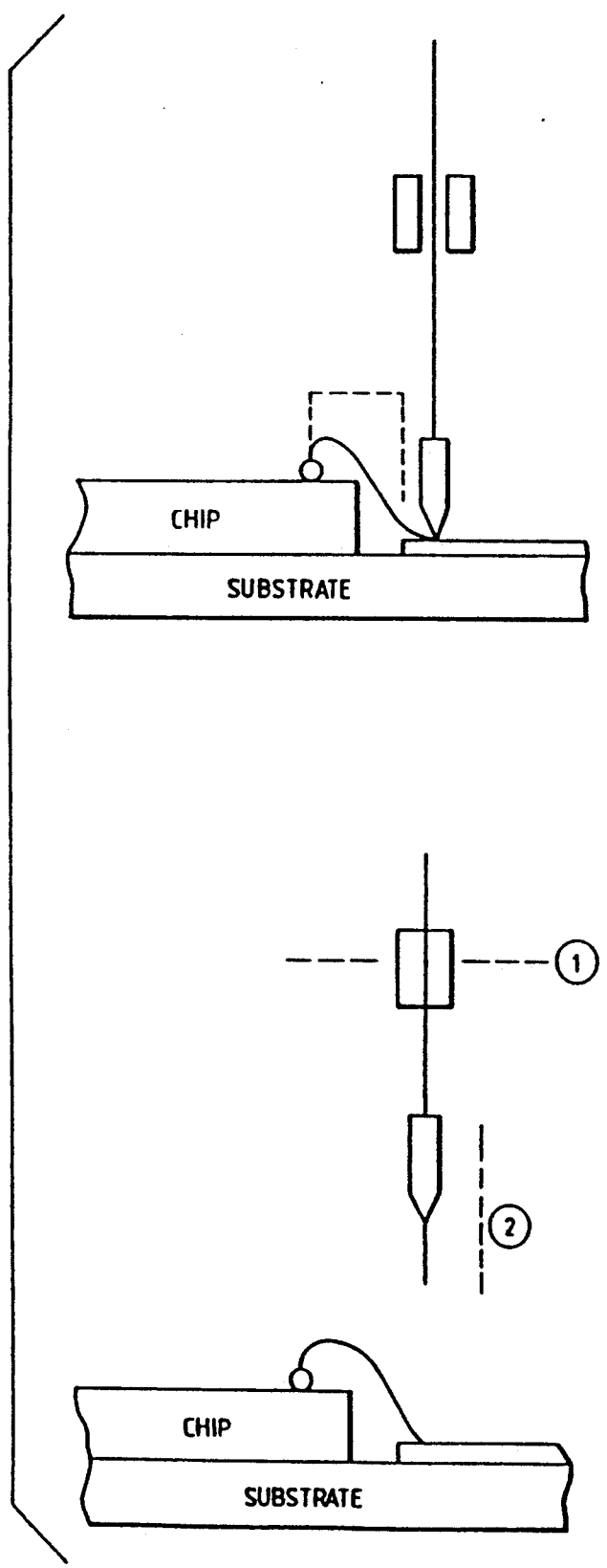
FIG. 25 is a schematic view showing the wire bonding method.
Figure 28:
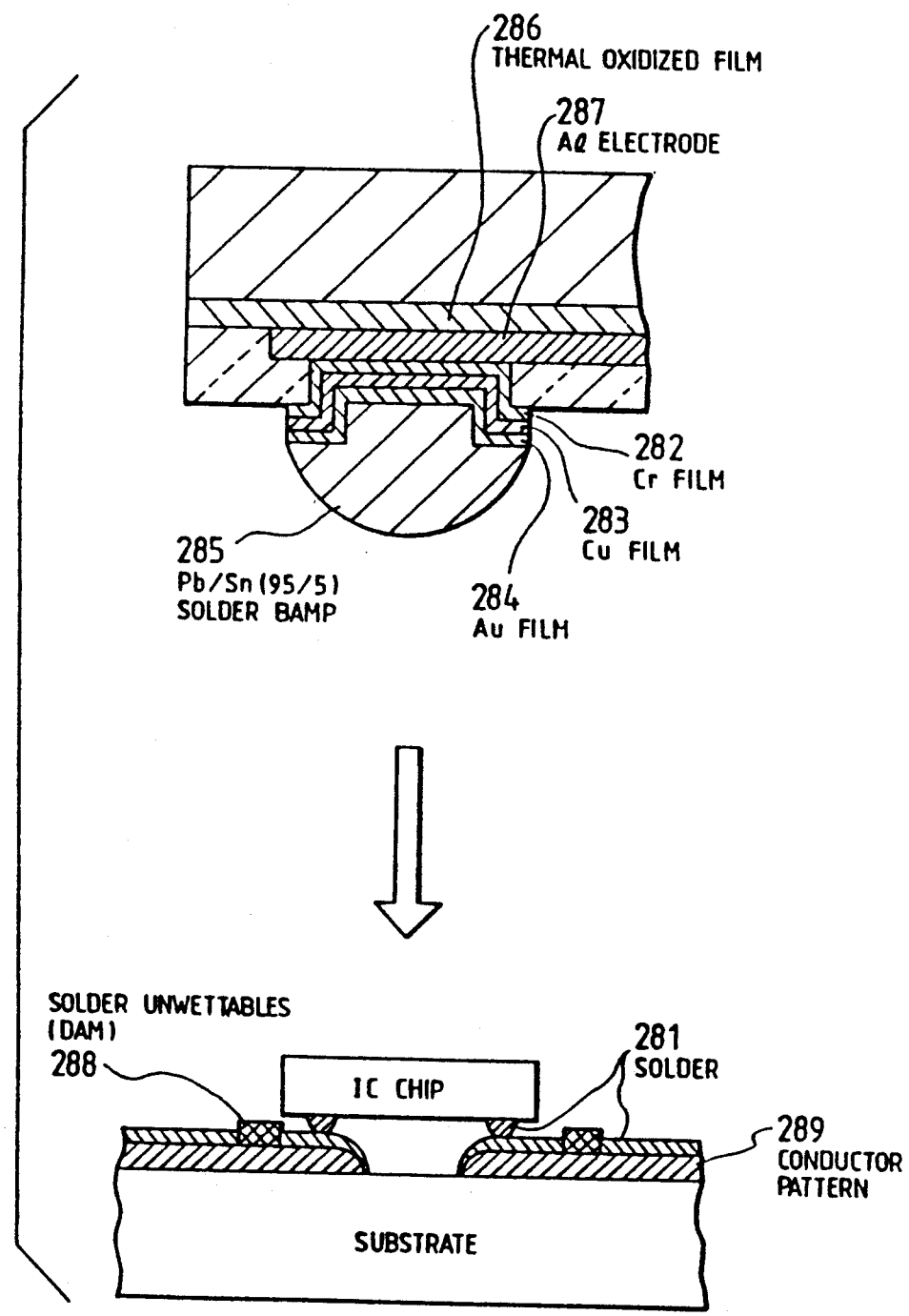
FIG. 28 is a sectional view showing the connection principle of the CCB method.

Incidentally, the life described above is calculated under the thermal cycle condition represented by oblique line (1) in FIG. 23 and is extended twice or thrice under the normal thermal condition.

As a result of the analysis of the electrical characteristics carried out separately from above, it is found that self-inductance is below 0.42 nH (nano-Henry) and resistance is below about 12 mΩ. Accordingly, there is no particular problem as an electrical connection medium.

The fundamental structure of the flexible connecting structure, to which the present invention is directed, can thus be accomplished by using a highly conductive metal such as Cu and connecting the LSI chip(s) to the wiring substrate through the spiral (eddy or whirlpool) micro-lead(s) under the floating state (with the proviso that one of its ends may be fixed).

Embodiment 3

Formation of micro-lead on wiring substrate - (2):

This embodiment represents a modified application example of the present invention. The through-hole conductor 4 is disposed vertically in the alumina substrate shown in FIG. 10. The substrate is prepared by sintering a bored (or perforated) alumina substrate by use of a Cu conductor paste.

In the formation method of the micro-lead described already, the Al film 14 as the lift-off material is formed in a thickness of about 6 μm by sputtering on the entire surface of the upper surface of the wiring substrate 42 which is formed in the manner described above, as shown in FIG. 7(b).

Figure 7A:
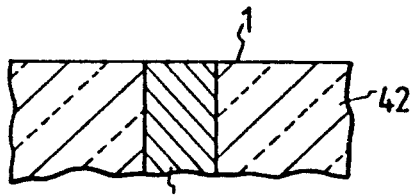
Figure 7B:
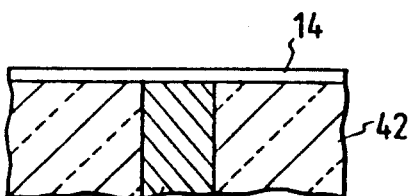
Figure 7C:
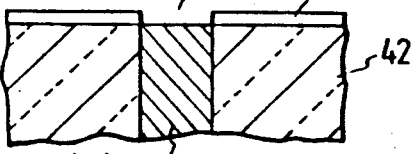

Then, the alkali-resistant resist (not shown) is coated and dried on the upper surface of the Al film 14, and after the resist at the portion of the Al film 14 on the through-hole conductor 4 is removed by photo-etching, the Al film 14 on the through-hole conductor 4 is removed by an 8% aqueous sodium hydroxide (NaOH) solution Thereafter, washing with water and drying are carried out to form the contact hole 15 under the state shown in FIG. 7(c). Incidentally, the diameter of this contact hole is about 110 μm.

Figure 7D:
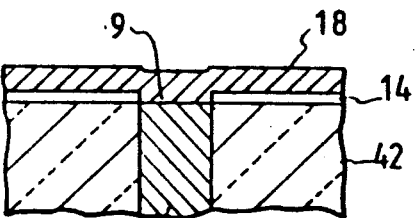

After the remaining resist on the Al film 14 on the wiring substrate is removed, the substrate is dipped into a copper pyrophosphate plating solution and a copper film 18 is formed on the entire surface of the Al film 14 in a thickness of about 20 μm by electro-plating as shown in FIG. 7(d). At this time, the through-hole conductor 4 in the contact hole 15 is directly bonded to the copper film 18 on the bond surface 9.

The wiring substrate 6, on which the copper film 18 is formed in this manner, is washed with water and dried and a positive type resist 20 is coated on the copper film 18 before the copper film 18 is oxidized. Thereafter, the resist 20 at the portion corresponding to the position of the solder bond portion 8 of the micro-lead is removed in the shape of a circle having a diameter of about 110 μm.

Figure 7E:
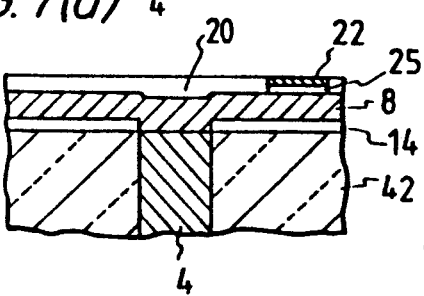

Then, after an about 0.5 μm-thick Ni layer 25 is formed by ordinary electro-plating on the portion where the resist is removed and the copper film 18 is exposed, as shown in FIG. 7(e), a 1 μm-thick Au (gold) layer 22 is formed.

Next, in order to form the micro-lead 7 shown in FIG. 17, the remaining resist film on the Cu film 18 of the wiring substrate 42 is removed and a negative type resist 49 is coated and dried afresh. After a large number of micro-lead pattern groups shown in FIG. 17 are exposed, the resist at the other portions is removed. Here, one of the bond portions 9 with the through-hole conductor 4 is aligned with the center of the circle of the through-hole conductor 4 and the other solder bond portion 8 is aligned with the center of the circle of the gold layer 22.

Figure 7F:
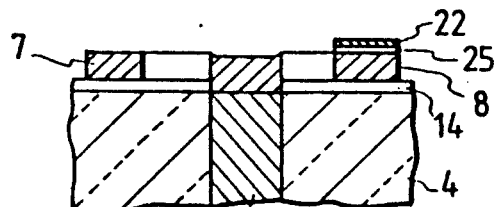

Next, the exposed portions of the copper film 18 at the portions other than those protected by the negative type resist are etched by use of an etching solution consisting of an aqueous ferric chloride (FeCl₃, Cl⁻ 35 g/l) solution to form the micro-leads 7 as shown in FIG. 7(f).

Figure 7G:
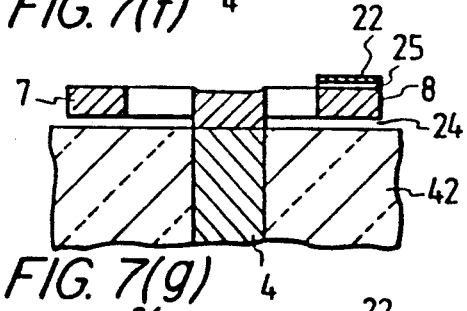
Figure 7H:
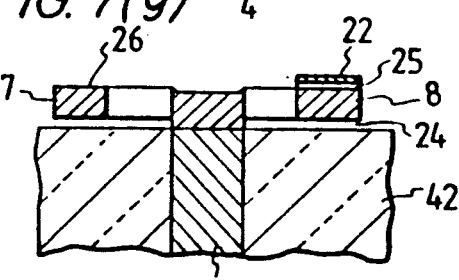

The Al film 14 is then dissolved and removed by use of an aqueous sodium hydroxide solution to form the gaps 24 between the micro-leads 7 and the wiring substrate 42 as shown in FIG. 7(g), followed then by washing with water and drying.

Subsequently, the wiring substrate 42 is heated at about 200° C. for 10 minutes in a stream of a mixed gas consisting of air and oxygen so as to oxidize all the surfaces 26 of the micro-leads 7 other than the metal 22. At this time, luster of the copper film surface is reduced and oxidation of the copper film surface can be confirmed. In this manner, the wiring substrate equipped with the micro-leads is produced.

Various dimensions of the wiring substrate equipped with the micro-leads that is produced in this manner are as follows.

(1) Dimension of micro-lead:
  lead belt width: 50 μm
  lead belt thickness: approx. 20 μm
  pitch between lead: 300 μm
(2) Number of micro-leads:
  per chip connection: 1,225

Embodiment 4

Connection of LSI chips - (1):

The end portion of each lead of the wiring substrate equipped with the micro-leads, that is prepared in Embodiment 2 by the process described above (the LSI chip connecting portion 8), is located to the solder ball 10 disposed already at the connecting terminal portion of the LSI chip by use of a half mirror, and the LSI chip is connected by an ordinary face-down bonding method. The connecting temperature at this time is at an instantaneous peak temperature of 300° C. in view of the melting point of the solder disposed on the LSI chip.

Figure 8:
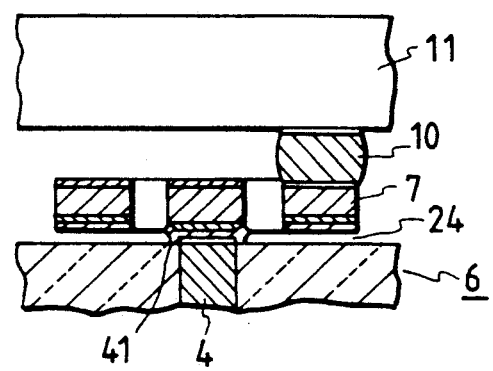
FIG. 8 is a theoretical partial sectional view of the connecting structure of the LSI chip.

FIG. 8 shows the state where the LSI chip 11 is connected to the micro-lead 7 of the wiring substrate in the manner described above. The drawing is a partial sectional view and reference numeral 6 represents the wiring substrate; 4 is the through-hole conductor; 7 is the micro-lead; 24 is the gap; 10 is the solder; and 11 is the LSI chip.

Embodiment 5

Connection of LSI chip - (2):

Connection of the LSI chip can be made before the lift-off layer is removed. In such a case, however, the lift-off material is preferably an organic material which is soluble in an organic solvent or a material which is soluble in hot water.

Figure 18A:
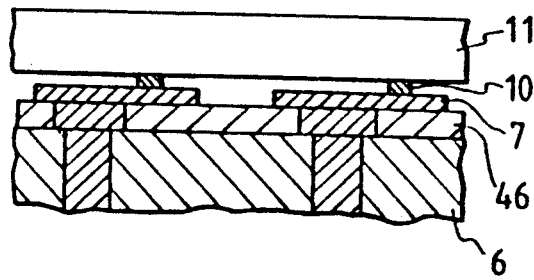
Figure 18B:
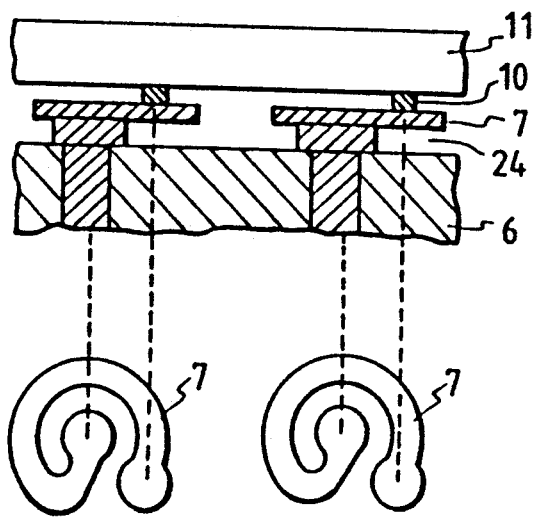
Figure 21A:
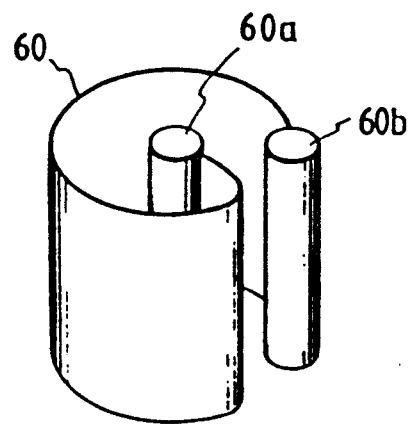
Figure 21B:
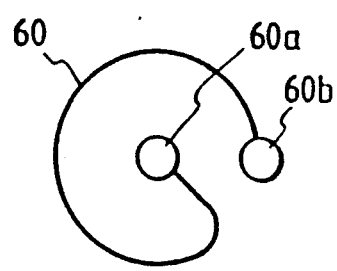
Figure 21C:
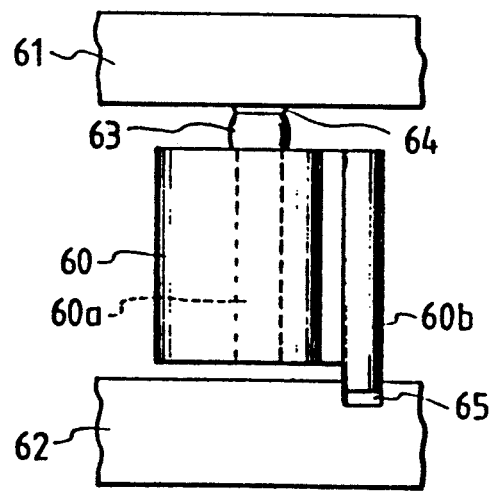

FIG. 18 shows one of its examples, wherein a heat-resistant organic resist soluble in trichlene is used as the lift-off material.

Embodiment 6

Thermal cycle test:

Thermal tests are carried out by placing the wiring substrates, to which the LSI chips have already been connected in Embodiments 4 and 5, into the chamber of a thermal impact tester at −50° C. to 150° C. and one cycle/hour. The results are shown in Table 1. This Table 1 altogether illustrates the differences and effects between the mere soldering method in accordance with the conventional CCB method and the method using the wiring substrate equipped with the micro-leads as one of the characterising features of the present invention.

The test result reveals that if the wiring substrate equipped with the micro-leads as one of the characterising features of the present invention is employed, the solder connected portion can sufficiently withstand the thermal cycle environment even if the $\alpha$ difference becomes great.

TABLE 1

| Connection Method | spring property | allowability of $\alpha$ difference* between LSI chip and substrate | thermal test of solder connected portion** |
|---|---|---|---|
| Conventional method (soldering only) | nil | ~35 | breakage existed*** |
| Embodiment of this invention | observed in X, Y, Z directions | ~130 | no breakage |

*coefficient of thermal expansion ($\times 10^{-7}$/°C.)
**−50~+150° C., $10^4$ cycles
***test result at $\alpha$ difference $40 \times 10^{-7}$/°C.

Embodiment 7

Spring property test:

The spring property of the micro-lead of each LSI chip connected in Embodiments 4 and 5 is tested. As a result, the test property is found to be 28.8 kg/mm per chip in the vertical (Z) direction of the sample of Embodiment 4 and 30.1 kg of the sample of Embodiment 5.

As a result, the micro-lead is found to have a spring property in the vertical direction. Therefore, the assembly of an electronic apparatus using the substrate, to which the LSI chips having the spring property in the vertical direction are connected, will be simplified in the following embodiments.

Embodiment 8

Assembly of electronic apparatus - (1):

Packaging and assembly of a central processing unit (CPU) of a large-scale electronic computer is carried out by use of the wiring substrate equipped with the micro-leads, to which the LSI chips are connected, and which is prepared in Embodiment 4. In this logic calculation unit, a large number of modules (one substrate to which 25 to 100 LSI chips are connected in Embodiment 4 is hereby referred to as one "module").

Figure 9:
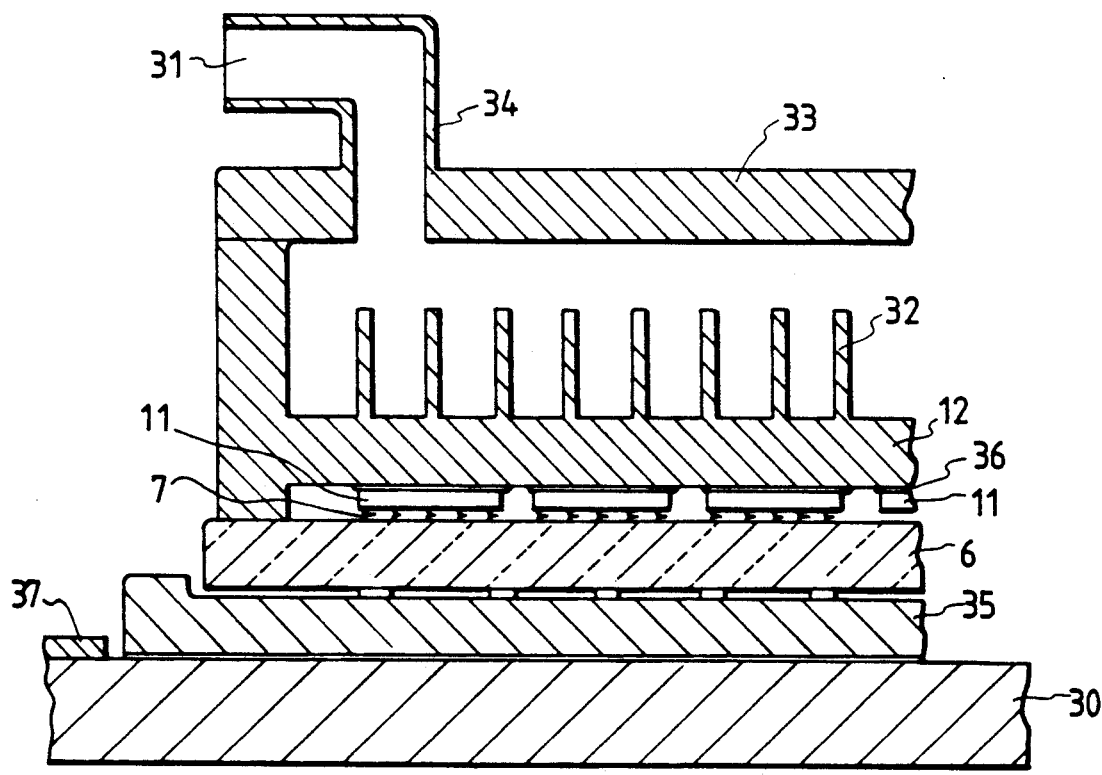
FIGS. 9 to 11 are partial sectional views showing the assembly structure of the electronic apparatus in accordance with the present invention.
Figure 22:
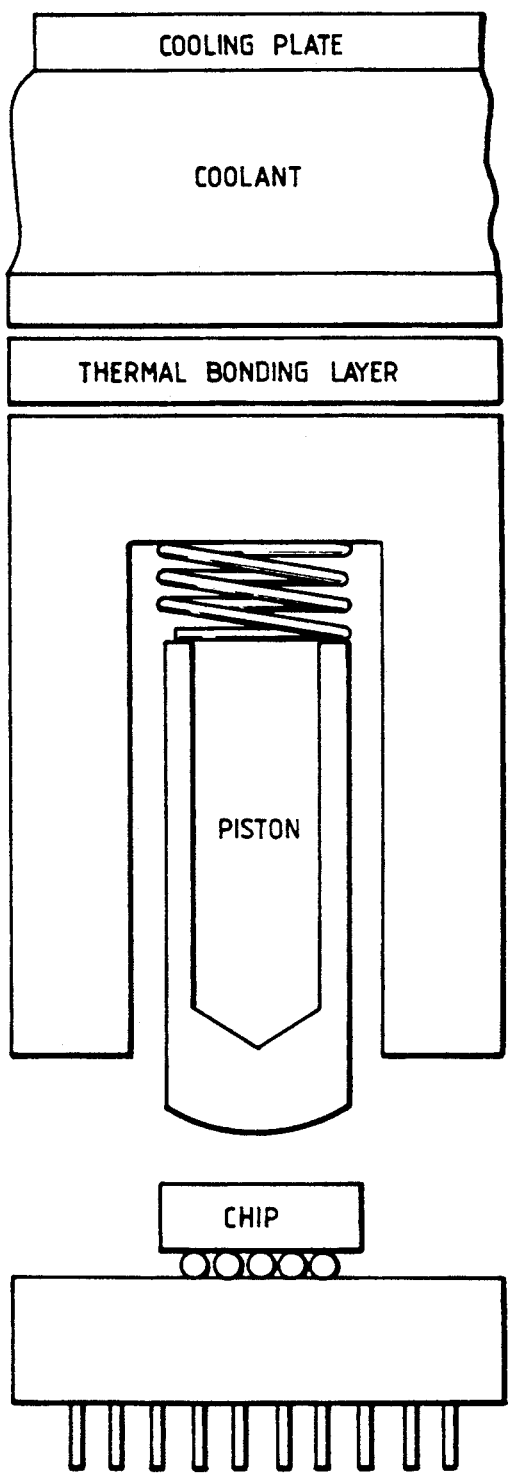
FIG. 22 is an explanatory view of the conventional method.

FIG. 9 is a sectional view of a part of one module among a large number of modules mounted to a board 30. In this drawing, the back of each LSI chip 11 connected to the wiring substrate 6 equipped with the micro-leads can be pressed sufficiently to the wall surface of the heat transfer block 12 by the spring property of the micro-lead in the vertical direction. Therefore, the heat transfer block 12 can eliminate the heat radiation stud (see FIGS. 22 and 27) of the conventional spring mechanism, and fins 32 having high heat exchange efficiency by water cooling can be disposed inside the heat transfer block 12. The heat exchange efficiency can be improved drastically by this water cooling and these fins. In FIG. 9, reference numeral 11 represents the LSI chip; 7 is the micro-lead; 6 is the wiring substrate; 35 is an electrical connector of a pin 5; 31 is a water passage of cooling water; 32 is the fin; 36 is a gold brazing material; 33 is a cooler cover; 34 is a cooling water pipe; 30 is the board; and 37 is a power cable of the module. However, the gold brazing material may be omitted.

In the manner described above, the structure of the electronic apparatus to be assembled, particularly the structure of the heat transfer block, can be simplified and the cooling effect can be improved.

Embodiment 9

Figure 10:
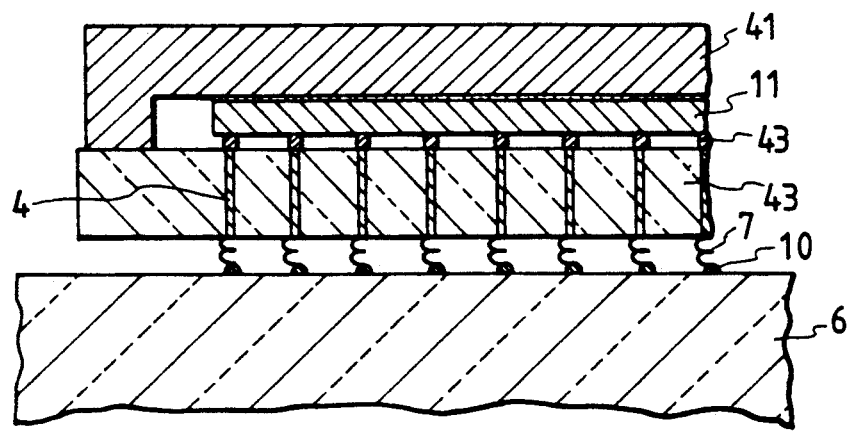

Assembly of electronic apparatus - (2):

The LSI chip is packaged as shown in FIG. 10 by use of the wiring substrate equipped with the micro-leads that is prepared in Embodiment 3. In the drawing, reference numeral 6 represents the wiring substrate having a large coefficient of thermal expansion; 7 is the micro-lead; 42 is the wiring substrate equipped with the micro-leads; 43 is the solder bump; 10 is the CCB solder; and 41 is the package cap.

Figure 11:
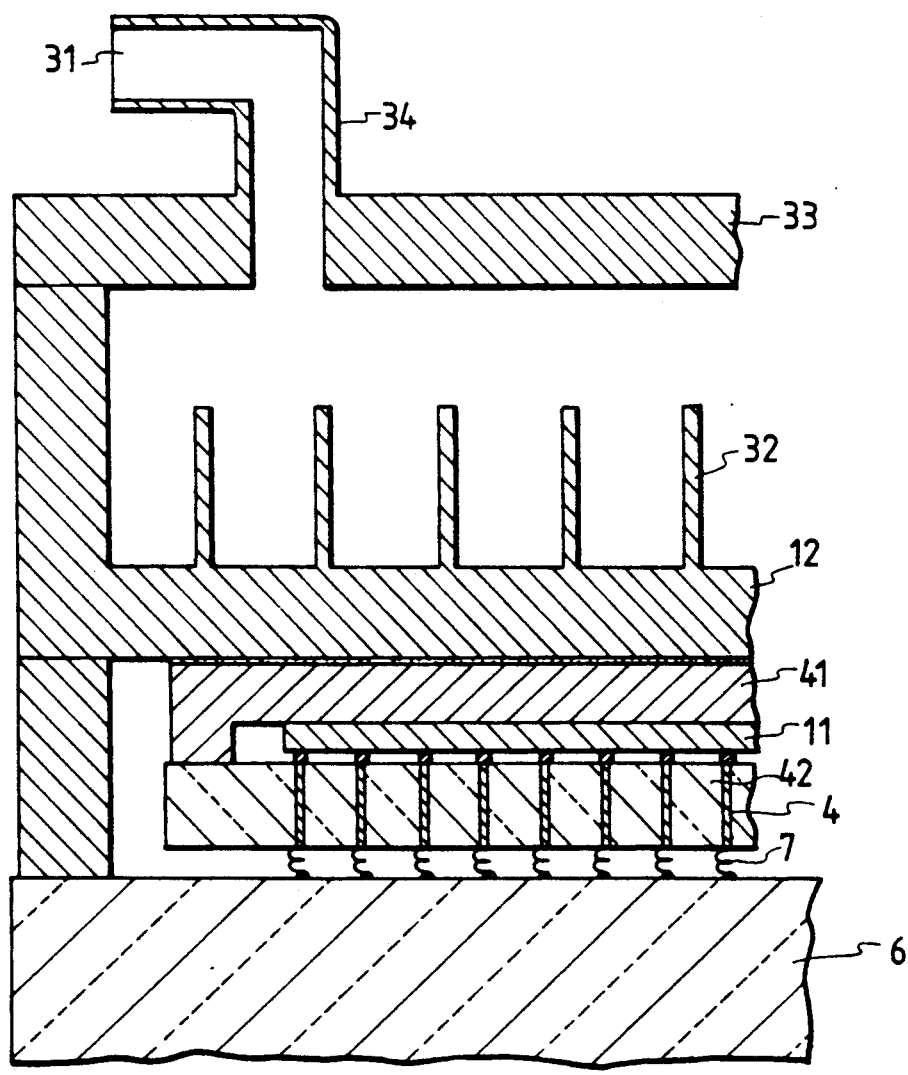
Figure 12A:
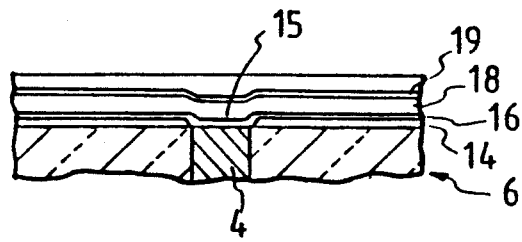
FIGS. 12(a)-(c) and 13(a)-(c) are theoretical views showing the production method of the wiring substrate equipped with the micro-leads which constitutes one of the characterizing features of the present invention.
Figure 12B:
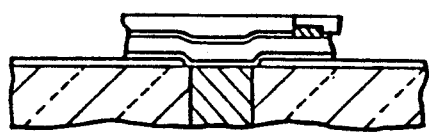
Figure 12C:
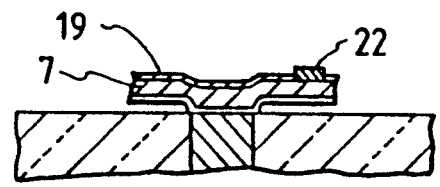
Figure 13A:
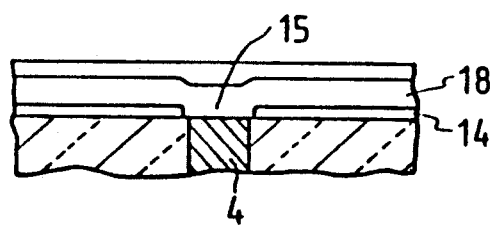
Figure 13B:
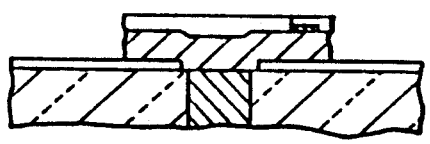
Figure 13C:
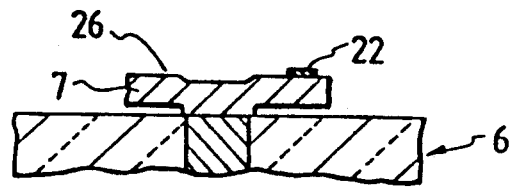

Next, the module compactly packaged as described above is placed into the casing of a large water cooler as shown in FIG. 11. In the drawing, reference numeral 11 represents the LSI chip; 41 is the LSI chip package cap; 12 is the heat transfer block; 32 is the fin; 33 is a cooler cover; 31 is the water passage; and 34 is the cooling water pipe.

In the manner described above, the back of the module itself (upper surface of 41) of the LSI chip module which has once been packaged can be pressed sufficiently to the wall surface of the heat transfer block 12 by the micro-leads provided to the bottom of the module. As a result, it is not necessary to dispose a heat radiation stud to the heat transfer block and the structure as well as production of the heat transfer block can be simplified. Moreover, the cooling effect can be improved by far drastically than the prior art devices by disposing the fins 32 at the space obtained by the simplification of the structure in cooperation with water cooling.

As described above, the present invention can provide the spring property or free deformability in all the horizontal and vertical directions when connecting electrically the electronic parts such as the LSI chips, and can simplify the assembly and structure of the electronic apparatus using the module thus connected. Owing to the simplification of the structure, it becomes possible to employ easily the water cooling system which can improve the cooling effect. Accordingly, the present invention can connect mutually the substrate and the electronic part having mutually different coefficients of thermal expansion and can improve their service life (durability). Furthermore, the present invention can simplify the assembly of the electronic apparatus and promote the cooling effect, and is very advantageous in the production industry of electronic apparatuses as can be appreciated from the numeric comparison tabulated in Table 2.

TABLE 2

| Item | Method | |
|---|---|---|
| | prior art method | present method |
| assembly of parts having different coefficients of thermal expansion | not suitable ($35 \times 10^{-7}$/°C.) | possible ($140 \times 10^{-7}$/°C.) |
| life of joint when coefficient of thermal expansion is different by $40 \times 10^{-7}$/°C. or more | duration not possible (breakage of joint) | possible ($> 10^4$ thermal cycles) |
| cooling efficiency of assembled electronic apparatus in operation | rated as 1 | up to ten times the prior art method |
| number of assembled parts of heat transfer block | " | 1/50~1/100 |
| production cost of this portion of electronic apparatus | " | 1/5~1/10 |

TABLE 3

Three Broad Classification of Conventional
LSI Chip Connection Systems and Their Features

| connection system | wire bond (W.B.) | tape carrier (T.A.B.) | flip chip (F.C.) |
|---|---|---|---|
| connecting structure | | | |
| minimum pitch | 135 μm | 80 μm | 250 μm |
| connectable area | only outer periphery | only outer periphery | entire surface |
| number of connection terminals | small | small | large |
| connection area on substrate | large | large | small |

TABLE 3-continued

Three Broad Classification of Conventional
LSI Chip Connection Systems and Their Features

| connection system | wire bond (W.B.) | tape carrier (T.A.B.) | flip chip (F.C.) |
|---|---|---|---|
| side packing density | low | low | high |

What is claimed is:

1. A connecting structure for an electronic part, comprising:
   conductor means for electrically connecting said electronic part;
   a substrate having an electrical conductor to be electrically connected to said conductor means of said electronic part; and
   a thin film lead member formed on said substrate into a planar shape of a two dimensional specified line being directly connected at only one part to said substrate sufficiently to provide substantial three dimensional spring movement from end to end, and having a width greater than a thickness of said lead member, and
   another part of said lead member being indirectly connected to sad conductor means, thereby connecting said conductor means to said electrical conductor at positions spaced along said specified line such that said electronic part and said substrate are mutually deformable relative to one another in any of a horizontal and vertical direction.

2. A connecting structure for an electronic part according to claim 1, wherein the edges of said thin film lead member are etched.

3. A connecting structure for an electronic part according to claim 1, wherein said thin film lead member is entirely made of electrically conductive material electroplated on said substrate.

4. A module, comprising a plurality of the connecting structures of claim 3 on a single substrate, wherein there are a plurality of said thin film lead members in a single deposited plane on said substrate and at a density of at least 1,000 connecting structures per 10 mm square.

5. A connecting structure for an electronic part according to claim 1, wherein said lead member has a spiral shape.

6. A connecting structure for an electronic part according to claim 2, wherein said lead member has a spiral shape.

7. A connecting structure for an electronic part according to claim 3, wherein said lead member has a spiral shape.

8. A module according to claim 4, wherein said lead member has a spiral shape.

9. A connecting structure for an electronic part according to claim 1, wherein said lead member and said electronic part are connected by a soldered connection.

10. A connecting structure for an electronic part according to claim 1, wherein said lead member and said electronic part are connected by a thermocompression bonded connection.

11. A connecting structure for an electronic part according to claim 1, wherein said lead member and said electronic part are connected by a brazed connection.

12. A connecting structure for an electronic part according to claim 1, wherein said lead member and said electronic part are connected by a welded connection.

13. A connecting structure for an electronic part according to claim 1, wherein said lead member is 10 to 40 um in thickness and 40 to 70 um in width.

14. A module according to claim 4, wherein said lead member is 10 to 40 um in thickness and 40 to 70 um in width.

15. A module according to claim 4, wherein said lead member is 20 um in thickness and 50 um in width.

16. A connecting structure for an electronic part according to claim 1, wherein the spring constant of said lead member is 100 to 600 g/mm in the horizontal direction and 25 to 90 g/mm in the vertical direction.

17. A connecting structure for an electronic part according to claim 1, wherein the spring constant of said lead member is 300 to 600 g/mm in the horizontal direction and 40 to 90 g/mm in the vertical direction.

18. A connecting structure for an electronic part according to claim 1, wherein the spring constant of said lead member is substantially 450 g/mm in the horizontal direction and substantially 65 g/mm in the vertical direction.

19. A connecting structure for an electronic part according to claim 1, wherein said lead member is made of copper, a copper alloy or a composite metal of copper.

20. A connecting structure for an electronic part according to claim 1, wherein an angular distance of said lead member from said electrode to the connecting point of said substrate is greater than 360 degrees.

21. A connecting structure for an electronic part according to claim 1, wherein said lead member is part of a conductive layer etched to form said shape and fixed on an insulation sheet.

22. A module, comprising a plurality of the connecting structures of claim 1 on a single substrate, wherein the density of said connecting structures is at least 1,000 per 10 mm square.

23. A module, comprising a plurality of the connecting structures of claim 2 on a single substrate, wherein the density of said connecting structures is at least 1,000 per 10 mm square.

24. A module, comprising a plurality of the connecting structures of claim 3 on a single substrate, wherein the density of said connecting structures is at least 1,000 per 10 mm square.

25. A connecting structure for an electronic part according to claim 1, further comprising a heat transfer block provided on said electronic part.

26. A connecting structure for an electronic part according to claim 1, wherein said lead member has a Cr-Cu-Cr three-layered structure.

27. A connecting structure for an electronic part according to claim 1, wherein said lead member and said electronic part are connected electrically through a gold layer.

28. A connecting structure for an electronic part according to claim 1, wherein said lead member consists of an aluminum film.

29. A connecting structure for an electronic part according to claim 1, wherein the connection between said lead member and said conductor means of said electronic part consists of a Ni-Au layer.

30. A connecting structure for an electronic part according to claim 1, wherein the surface of said lead member is covered with an oxide film of the lead member material, at the portions other than the connecting point between said lead member and said conductor means of said electronic part.

31. A connecting structure for an electronic part according to claim 1, wherein the major portion of said lead member is fabricated on an insulating sheet.

32. A connecting structure for an electronic part according to claim 31, wherein said insulating sheet is made of a polyimide resin, glass-epoxy resin, glass-polyimide resin, polyester resin, polyimide resin containing quartz fiber, or a resin containing carbon fiber.

33. A connecting structure for an electronic part according to claim 1, wherein said substrate is composed of a ceramic or a glass-epoxy resin material.

34. A connecting structure for an electronic part, comprising:
conductor means for electrically connecting said electronic part;
a substrate having an electrical conductor to be electrically connected to said conductor means of said electronic part;
a thin film lead member formed on said substrate into a planar shape of a two dimensional specified line being directly connected at only one part to said substrate sufficiently to provide spring movement, and having a width greater than a thickness of said lead member,
another part of said lead member being indirectly connected to said conductor means, thereby connecting said conductor means to said electrical conductor at positions spaced along said specified line such that said electronic part and said substrate are mutually deformable relative to one another in any of a horizontal and vertical direction.

35. A connecting structure for an electronic part according to claim 34, wherein said lead member is 10 to 40 um in thickness and 40 to 70 um in width.

36. A module, comprising a plurality of the connecting structures of claim 35 on a single substrate, wherein the density of said connecting structures is at least 1,000 per 10 mm square.

37. A module, comprising a plurality of the connecting structures of claim 34 on a single substrate, wherein the density of said connecting structures is at least 1,000 per 10 mm square.

38. A module, comprising a plurality of the connecting structures of claim 65, wherein said direct connection is said thin film being deposited directly on said substrate.

39. A connecting structure for an electronic part, comprising:
conductor means for electrically connecting said electronic part;
a substrate having an electrical conductor to be electrically connected to said conductor means of said electronic part; and
a deposited thin film lead member deposited on said substrate into a planar shape of a specified line and being directly deposited connected at only one part to said substrate sufficiently to provide substantial three dimensional spring movement between the one part and another part, and
another part of said deposited thin lead member being connected to said conductor means, thereby connecting said conductor means to said electrical conductor at positions spaced apart along said specified line such that said electronic part and said substrate are mutually deformable relative to one another in any of a horizontal and vertical direction.

40. A module, comprising a plurality of the connecting structures of claim 39 on a single substrate, wherein the density of said connecting structures is at least 1,000 per 10 mm square.

41. A connecting structure for an electronic part according to claim 39, wherein the surface of said lead member is covered with an oxide film of the lead member material, at the portions other than the connecting point between said lead member and said conductor means of said electronic part.

* * * * *